(12) United States Patent
Ohsawa

(10) Patent No.: US 6,654,126 B1
(45) Date of Patent: Nov. 25, 2003

(54) OPTICAL GYRO WITH SPECIFIC CLOCK/CALCULATION CIRCUIT

(75) Inventor: Toshifumi Ohsawa, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 386 days.

(21) Appl. No.: 09/724,077

(22) Filed: Nov. 28, 2000

(30) Foreign Application Priority Data

Dec. 1, 1999 (JP) .......................................... 11-342340

(51) Int. Cl.$^7$ ............................................. G01C 19/72
(52) U.S. Cl. ...................................................... 356/461
(58) Field of Search .................................. 356/459, 461

(56) References Cited

U.S. PATENT DOCUMENTS

| | | | |
|---|---|---|---|
| 3,373,650 A | 3/1968 | Killpatrick | |
| 3,467,472 A | 9/1969 | Killpatrick | |
| 3,879,130 A | 4/1975 | Greenstein | |
| 4,120,587 A | 10/1978 | Vali et al. | |

(List continued on next page.)

FOREIGN PATENT DOCUMENTS

| | | | |
|---|---|---|---|
| GB | 2017392 | 10/1979 | |
| JP | 57-043486 | 3/1982 | |
| JP | 59-41883 | 3/1984 | |
| JP | 60-148185 | 8/1985 | |
| JP | 4-174317 | * 6/1992 | |
| JP | 5-288556 | 11/1993 | |
| JP | 6-038529 | 2/1994 | |
| JP | 6-140364 | 5/1994 | |
| JP | 7-131123 | 5/1995 | |
| JP | 7-146150 | 6/1995 | |
| JP | 8-18166 | 1/1996 | |
| JP | 8-125251 | 5/1996 | |

OTHER PUBLICATIONS

U.S. Patent Application Publication No. US2002/0176087 A1, by Numai.
EP Application No. 00100856.4 (EP counterpart of the U.S. Pat. Appl. Pub. No. US2002/0176087 A1).
English abstract of JP8–125251.
English abstract of JP8–18166.
English abstract of JP7–146150.
English abstract of JP7–131123.
English abstract of JP6–140364.
English abstract of JP06–038529.
English abstract of JP05–288556.
English abstract of JP04–174317.
English abstract of JP60–148185.
English abstract of JP59–41883.
English abstract of JP57–043486.

*Primary Examiner*—Samuel A. Turner
(74) *Attorney, Agent, or Firm*—Morgan & Finnegan, L.L.P.

(57) ABSTRACT

An angular velocity detecting apparatus comprises a ring laser including a tapered light waveguide of an asymmetrical shape in at least a portion of a light waveguide so that the oscillation threshold values of laser beams propagating round in opposite directions of rotation may differ from each other, an optical gyro having a terminal for detecting any change in at least one of an electric current, a voltage and impedance in the ring laser, a measuring device for measuring the information of the cycle of the change in at least one of the electric current, the voltage and the impedance outputted from the terminal of the gyro, a clock generation device for generating a predetermined clock for sampling, and a calculation circuit for inputting the result of the measurement by the measuring device at a predetermined sampling cycle, and calculating information regarding an angular velocity on the basis of the result of the measurement. The predetermined sampling cycle generated by the clock generation device is longer than the cycle of the change in at least one of the electric current, the voltage and the impedance produced by the optical gyro within the necessary range for the detection of the angular velocity.

12 Claims, 13 Drawing Sheets

U.S. PATENT DOCUMENTS

| | | |
|---|---|---|
| 4,229,106 A | 10/1980 | Dorschner et al. |
| 4,429,997 A | 2/1984 | Matthews |
| 4,431,308 A | 2/1984 | Mitsuhashi et al. |
| 4,521,110 A | 6/1985 | Roberts et al. |
| 4,718,766 A | 1/1988 | Greenstein |
| 4,913,548 A | 4/1990 | Vick |
| 5,037,203 A | 8/1991 | Yeh |
| 5,400,141 A | 3/1995 | Albers et al. |
| 5,414,727 A * | 5/1995 | Berndt et al. ............ 372/38.07 |
| 5,764,681 A * | 6/1998 | Ballantyne et al. ........... 372/94 |
| 6,219,366 B1 | 4/2001 | Furushima |
| 6,297,883 B1 | 10/2001 | Numai |
| 6,465,771 B2 * | 10/2002 | Ohsawa ................. 250/231.12 |

* cited by examiner

OPTICAL GYRO WITH SPECIFIC CLOCK/CALCULATION CIRCUIT

BACKGROUND OF THE INVENTION

1. Field of the Invention

This invention relates to an angular velocity detecting apparatus, and particularly to an apparatus for detecting rotational angular velocity by the utilization of a ring laser type gyro.

2. Related Background Art

A mechanical gyro having a rotor or a vibrator and an optical gyro are known as gyros for detecting the angular velocity of a moving object. Particularly the optical gyro is capable of starting in a moment and has a wide dynamic range and therefore is bringing about an innovation in the technical field of gyro. Optical gyros include a ring laser type gyro, an optical fiber gyro, a passive type ring resonator gyro, etc. Among these, the ring laser type gyro using a gas laser is the one of which the development has been started earliest, and has already been put into practical use in aircraft, etc. Recently, as a compact and highly accurate ring laser type gyro, there is a semiconductor laser gyro integrated on a semiconductor substrate.

FIG. 12 of the accompanying drawings is a plan view of an example of the optical gyro which can detect not only the magnitude of angular velocity but also a direction of rotation. The reference numeral 10 designates a quartz tube, the reference numeral 11 denotes the asymmetrical tapered portion of a light waveguide, the reference numeral 12 designates a mirror, the reference numeral 13 denotes an anode, the reference numeral 14 designates an electrical terminal, the reference numeral 15 denotes a cathode, the reference numeral 100 designates a counter-clockwise laser beam, and the reference numeral 110 denotes a clockwise laser beam.

It is to be understood here that the wavelength of a first laser beam travelling round clockwisely is $\lambda_1$. Also, it is to be understood that the wavelength of a second laser beam travelling round counter-clockwisely is $\lambda_2$ ($<\lambda_1$) When the laser is rotated clockwisely, the oscillation frequency $f_1$ of the clockwise first laser beam decreases by $$\Delta f_1 = \frac{2S_1}{\lambda_1 L_1} \Omega \quad (1)$$

as compared with the oscillation frequency $f_{10}$, during the non-rotation. Here, $S_1$ is the closed area surrounded by the optical path of the first laser beam, $L_1$ is the length of the optical path of the first laser beam, and $\Omega$ is the angular velocity of the rotation. On the other hand, the oscillation frequency $f_2$ of the counter-clockwise second laser beam increased by $$\Delta f_2 = \frac{2S_2}{\lambda_2 L_2} \Omega \quad (2)$$

as compared with the oscillation frequency $f_{20}$ during the non-rotation. Here, $S_2$ is the closed area surrounded by the optical path of the second laser beam, and $L_2$ is the length of the optical path of the second laser beam. At this time, the first laser beam and the second laser beam coexist in the laser. Accordingly, a beat light having the difference between the oscillation frequencies of the first laser beam and the second laser beam, etc., $$f_2 - f_1 = f_{20} - f_{10} + (\Delta f_2 + \Delta f_1) = f_{20} - f_{10} + \left(\frac{2S_2}{\lambda_2 L_2}\Omega + \frac{2S_1}{\lambda_1 L_1}\Omega\right) \quad (3)$$

is created in the laser. On the other hand, during the counter-clockwise rotation, a beat light having a frequency indicated in the following expression (4) is created.

$$f_2 - f_1 = f_{20} - f_{10} - (\Delta f_2 + \Delta f_1) = f_{20} - f_{10} - \left(\frac{2S_2}{\lambda_2 L_2}\Omega + \frac{2S_1}{\lambda_1 L_1}\Omega\right) \quad (4)$$

When two or more oscillation modes exist in the laser, the inverted population exhibits a time fluctuation conforming to the difference between the oscillation frequencies of the modes. This phenomenon is known as the pulsation of inverted population. In the case of a laser letting an electric current flow such as a gas laser or a semiconductor laser, there is the correspondence relation of 1 to 1 between the inverted population and the impedance of the laser. When lights interfere with each other in the laser, the inverted population changes in conformity therewith and as the result, the impedance between the electrodes of the laser changes. The manner of this change appears as a change in a terminal current if a constant voltage source is used as a driving power source. Also, if a constant current source is used, the manner of interference between lights can be taken in the form of a signal as a change in a terminal voltage. Of course, any change in the impedance can also be directly measured by an impedance meter.

Accordingly, by providing a terminal for detecting any change in the electric current, voltage or impedance of the laser, a beat signal conforming to rotation can be taken out from this terminal. Further, as shown in expressions (3) and (4), the beat frequency increases or decreases in conformity with the direction of rotation.

Accordingly, by observing an increase or decrease in the beat frequency from during the non-rotation, the direction of rotation can be detected. It is when the difference between the oscillation frequencies satisfies the following expression (5) that the direction of rotation can be detected.

$$f_2 - f_1 \geq 0 \quad (5)$$

If the oscillation wavelengths of the first laser beam and the second laser beam are equal to each other, $$f_{20} - f_{10} = 0 \quad (6)$$

and the beat frequency $f_2 - f_1$ assumes positive and negative signs. If the absolute values of the beat frequencies are equal to each other, the same signal is outputted from terminals and therefore, in this case, the direction of rotation cannot be detected.

In contrast, if design is made such that the signs of the beat frequencies are always the same (in the description, the sign is taken as positive) and the absolute values thereof change depending on the direction of rotation, the detection of the direction of rotation will become possible.

Now, to change the oscillation threshold values of the laser beams propagating round in opposite directions of rotation in the ring laser, loss can be given to only the light propagating round in one direction of rotation. For example, by providing a tapered portion of an asymmetrical shape on a portion of the light waveguide, the total reflection condition deviates relative to a light incident on this tapered portion. Therefore, mirror loss occurs to the light incident on the tapered portion. The angle of incidence onto the tapered portion differs depending on the direction of rotation of the light and therefore, loss can be made great to the laser beam propagating round in a certain direction and loss can be made small to the light propagating round in the opposite direction. As the result, the oscillation threshold value can be changed for the laser beams propagating round in opposite directions of rotation.

Now, it is known that when two modes coexist, there are relations shown in the following expressions (7) and (8) between the oscillation frequency fi and photon number density Si (i=1, 2).

$$2\pi f_1 + \Phi_1 = \Omega_1 + \sigma_1 - \rho_1 S_1 - \tau_{12} S_2 \quad (7)$$

$$2\pi f_2 + \Phi_2 = \Omega_2 + \sigma_2 - \rho_2 S_2 - \tau_{21} S_1 \quad (8)$$

Here, $\Phi i$ is a phase, $\Omega i$ is an resonance angle frequency, $\sigma i$ is a coefficient representative of the entrainment of the mode, $\rho i$ is a coefficient representative of the self-extrusion of the mode, and $\tau i j$ is a coefficient indicative of the mutual extrusion of the modes. Here, i, j=1, 2; i≠j. Since the oscillation threshold value differs, the photon number density Si (i=1, 2) differs. Accordingly, in accordance with expressions (7) and (8), a difference can be given between the oscillation frequencies.

Specifically, for example, in the above-described construction, a quartz block is hollowed out by the use of a drill to thereby form the quartz tube 10. Thereafter, the mirror 12 is attached to the quartz tube 10. The anode 13, the electrical terminal 14 and the cathode 15 are further attached to the quartz tube 10. Next, helium gas and neon gas are introduced into the quartz tube 10, and when a voltage is applied between the anode and the cathode, discharge begins and an electric current comes to flow. Then, the counter-clockwise laser beam 100 and the clockwise laser beam 110 oscillate in the quartz tube 10.

When the quartz tube 10 is stationary, the oscillation frequencies of the laser beam 100 and the laser beam 110 are substantially equal to each other, i.e., $4.73 \times 10^{15}$ Hz, and the oscillation wavelength $\lambda$ thereof is 632.8 nm. However, the tapered portion 11 of the optical waveguide is of an asymmetrical shape and therefore, the oscillation threshold value for the laser beam 100 is smaller than the oscillation threshold value for the laser beam 110. Therefore, the light intensity of the laser beam 100 is greater than the light intensity of the laser beam 110. As the result, the oscillation frequency $f_1$ of the laser beam 100 is greater by 20 MHz than the oscillation frequency $f_2$ of the laser beam 110. The laser beams 100 and 110 interfere with each other in the quartz tube 10. At this time, the power source current is adjusted so as to become constant, and when the voltage between the electrode terminal 14 and the cathode 15 is monitored, a signal of an amplitude 100 mV and a frequency 20 MHz is obtained. That is, even when the quartz tube 10 is stationary, a beat voltage can be detected.

Now, when the quartz tube 10 is clockwisely rotated at a speed of 1 degree per second and the length of a side of a resonator is 10 cm, the oscillation frequency $f_1$ of the counter-clockwise laser beam 100 increases by 248.3 kHz. On the other hand, the oscillation frequency $f_2$ of the clockwise laser beam 110 decreases by 248.3 kHz. Accordingly, the beat frequency becomes $(f_1-f_2)=20$ MHz+ 496.6 kHz. On the other hand, when the quartz tube 10 is counter-clockwisely rotated at a speed of 1 degree per second, the beat frequency becomes $(f_1-f_2)=20$ MHz–496.6 kHz. The absolute value of the amount of increase or decrease of the beat frequency is proportional to the rotating speed and therefore, not only the detection of the rotating speed is possible, but also the detection of the direction of rotation becomes possible because the direction of rotation and the increase or decrease in the beat frequency correspond to each other at 1 to 1.

In this case, constant current driving has been used and a change in the terminal voltage has been measured, but if constant voltage driving is used, any change in the electric current flowing through the terminal can be detected. Also, any change in the impedance of discharge may be directly detected by the use of an impedance meter.

Thereby, a photodetector for detecting the beat light becomes unnecessary and as the result, return light noise which may be caused by the return light from the photodetector becomes null.

While helium gas and neon gas have been used herein, any gas which may be laser-oscillated may be used. Also, the shape surrounded by the optical path of the light waveguide is not limited to a square, but may be a shape such as a hexagon, a triangle or a circle.

FIG. 13A of the accompanying drawings shows an example of the change in angular velocity to which the gyro is subjected, and the side on which the angular velocity $\Omega$ is positive relative to 0 is the clockwise direction, and the side on which the angular velocity $\Omega$ is negative relative to 0 is the counter-clockwise direction. In the example of the angular velocity indicated by solid line 51, it is represented that with the lapse of time, the angular velocity in the clockwise direction changes to the angular velocity in the counter-clockwise direction.

FIG. 13B of the accompanying drawings shows an example of the change in the terminal voltage Vg of the gyro for a change in angular velocity indicated by 51, and it is represented that as indicated by curve 52, the frequency of a change in beat voltage appearing in the terminal voltage by the interference between the laser beams changes to a low frequency side with a change in an angular velocity.

FIG. 13C of the accompanying drawings shows the voltage waveform of a rectangular wave obtained by comparing the terminal voltage indicated by this curve 52 at the level of Vref of FIG. 13C. Information regarding the angular velocity can be obtained if the time interval of e.g. the rising edge of the voltage 53 of this rectangular wave or the number of edges measured within a predetermined time is measured.

FIG. 14 of the accompanying drawings shows the relation between the angular velocity applied to the gyro and the frequency of the beat voltage, and the beat frequency at the angular velocity 0 is defined as $f_0$. In FIG. 14, the maximum angular velocity in the necessary range for detection is represented as $\Omega mx$, and the beat frequency in that case is represented as fmx, and the minimum angular velocity in the necessary range for detection is represented as $\Omega mn$, and the beat frequency in that case is represented as fmn. $\Omega_0$ is the angular velocity at which the beat frequency becomes 0. It is indicated by a straight line 54 that when the angular velocity increases in the clockwise direction, the beat frequency becomes high, and when the angular velocity increases in the counter-clockwise direction, the beat frequency becomes low. In apparatuses incorporating and utilizing the gyro (for example, a camera, binoculars, a navigation apparatus, etc.), there are the necessary ranges for detection and necessary detection resolution of angular velocity required in conformity with the respective apparatuses. As an example, when angular velocity detection for preventing hand vibration is to be effected with a gyro mounted on a still camera, it is known that it is enough if angular velocity in the range of about –20 to +20 degrees/ sec. can be detected at resolution of the order of 0.1 degree/sec. In the above-described example of the camera, Ωmx=20 degrees/sec. and Ωmn=−20 degrees/sec. Also, there are frequency characteristics, etc. required in conformity with the characteristics of the apparatuses incorporating and utilizing the gyro, and as an example of the case of a system for preventing the hand vibration of the still camera, it is necessary that as the overall frequency characteristic of the system, the order of DC—100 Hz be a band and particularly, in the range of DC—30 Hz, the phase delay be −15° or less. It is also known that when a system for the prevention of the hand vibration of a still camera satisfying such a frequency characteristic is to be built by digital control, the detection of the angular velocity by the hand vibration must be effected at each interval of at least about 1 msec. with the time required for digital calculating process, etc. taken into account.

Here, in a ring laser gyro, the information of angular velocity is represented by a change in the frequency of the terminal voltage and therefore, unless the change in the frequency of the terminal voltage is detected at a time interval whereat the angular velocity is detected, the frequency characteristic of the above-described system cannot be satisfied. Specifically, in a system wherein the detection of angular velocity need be effected at each interval of 1 msec., it is necessary that in the whole of the necessary range for the detection of the angular velocity, it is necessary to make the beat frequency the ring laser gyro outputs to the terminal voltage higher than at least 1 kHz (shorter than 1 msec. as the cycle).

Also, even if there is adopted a processing circuit for converting the change in frequency by a change in angular velocity into a change in voltage by an FV conversion circuit and effecting the detection of the angular velocity, an analog circuit such as the FV conversion circuit includes such parts difficult to integrate as a capacitor and a resistor, and particularly when such an angular velocity detecting apparatus is to be mounted on a compact electronic apparatus such as a camera, it is not always suitable in terms of the space or cost of the processing circuit.

So, this invention has as its task to provide an angular velocity detecting apparatus suitable for being made into an integrated circuit and capable of accurately accomplishing angular velocity detection.

SUMMARY OF THE INVENTION

One aspect of this invention is an angular velocity detecting apparatus provided with a ring laser including a tapered light waveguide having an asymmetrical shape in at least a portion of the light waveguide so that the oscillation threshold values of laser beams propagating round in opposite directions of rotations may differ from each other, an optical gyro having a terminal for detecting any change in the electric current, voltage or impedance of the ring laser, a measuring device for measuring the information of the cycle of the change in the electric current, voltage or impedance outputted from the terminal of the optical gyro, a clock generating device for generating a predetermined sampling clock, and a calculation circuit for inputting the result of the measurement by the measuring device at a predetermined sampling cycle, and calculating information regarding angular velocity on the basis of the result of the measurement, and within the necessary range for the detection of the angular velocity, the cycle of the change in the electric current, voltage or impedance produced by the optical gyro is made shorter than the sampling cycle.

One aspect of this invention is an angular velocity detecting apparatus provided with the above-described ring laser, the above-described optical gyro, a measuring device for measuring the information of the frequency of any change in an electric current, a voltage or impedance outputted from the terminal of the optical gyro, a clock generation device for generating a predetermined clock for sampling, and a calculation circuit for inputting the result of the measurement by the measuring device at a predetermined sampling frequency, and calculating information regarding angular velocity on the basis of the result of the measurement, and within the necessary range for the detection of the angular velocity, the frequency of the change in the electric current, voltage or impedance produced by the optical gyro is made higher than the sampling frequency.

DESCRIPTION OF THE PREFERRED EMBODIMENTS

First Embodiment

Figure 12:
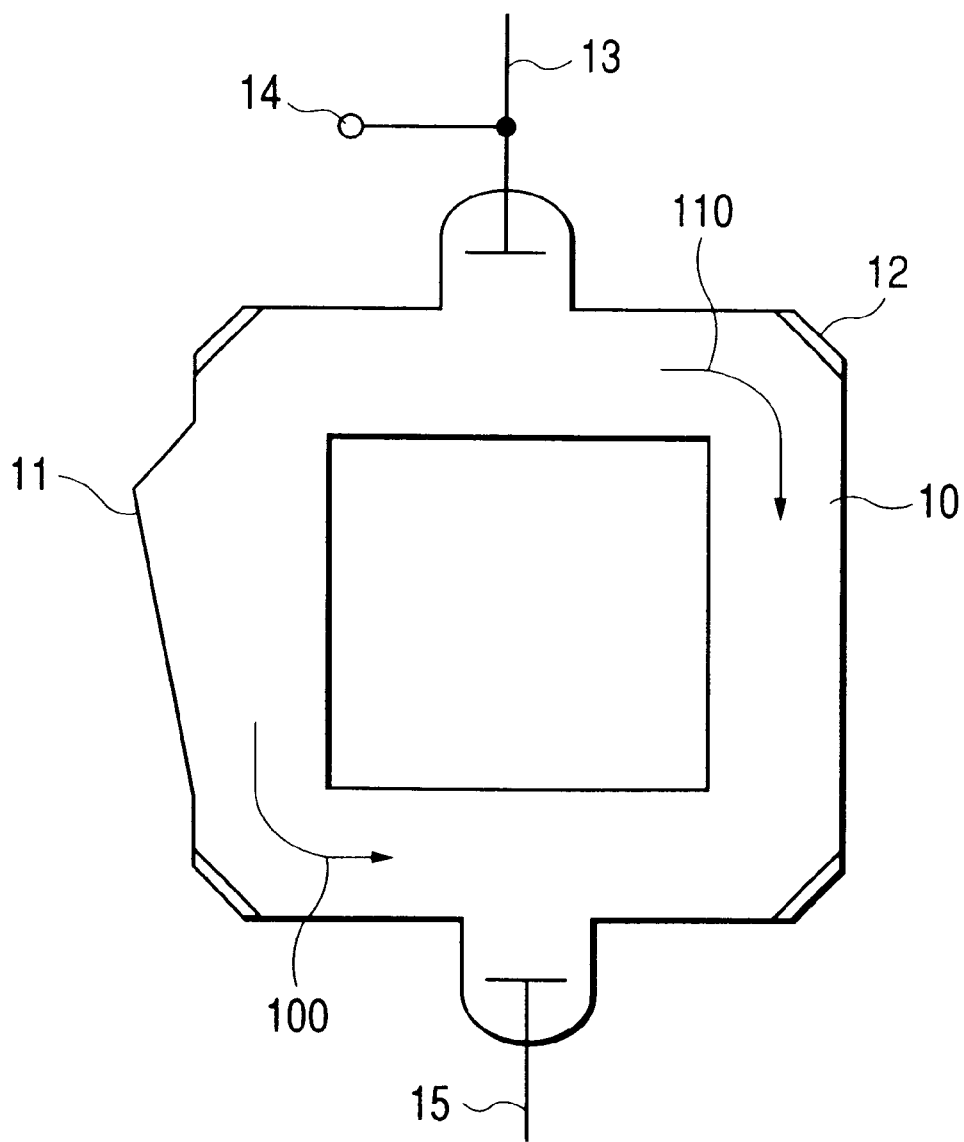
FIG. 12 is a plan view of an example of the ring laser gyro.
Figure 13A:
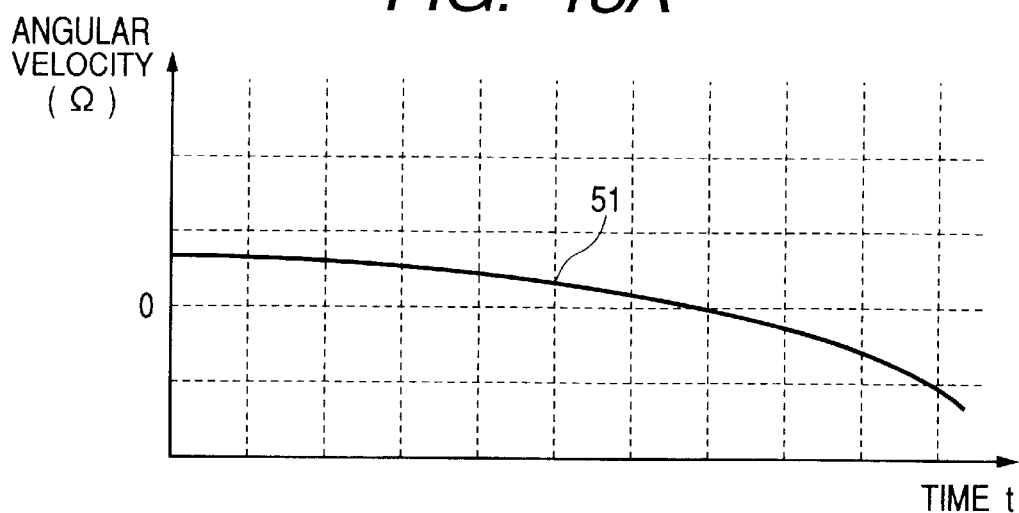
FIGS. 13A, 13B and 13C are a graph and waveform graphs showing the relation between the terminal voltage of the ring laser and angular velocity.
Figure 13B:
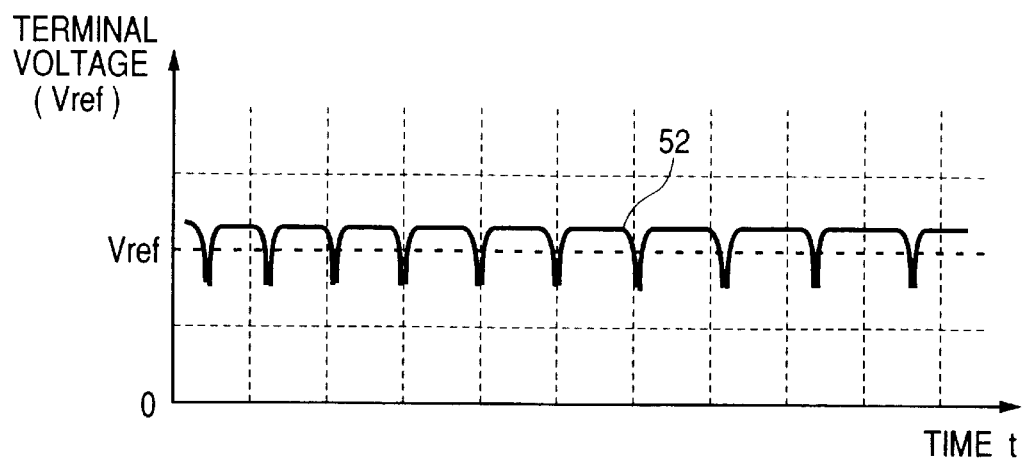
Figure 13C:
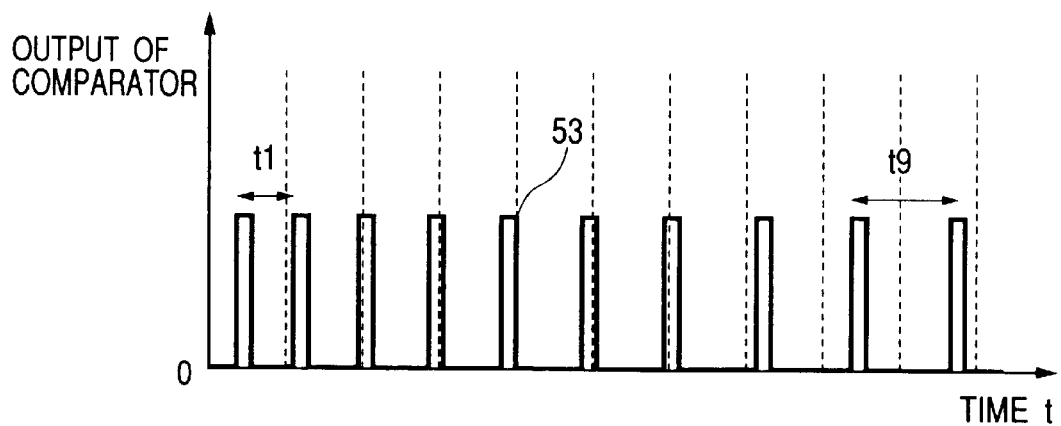
Figure 14:
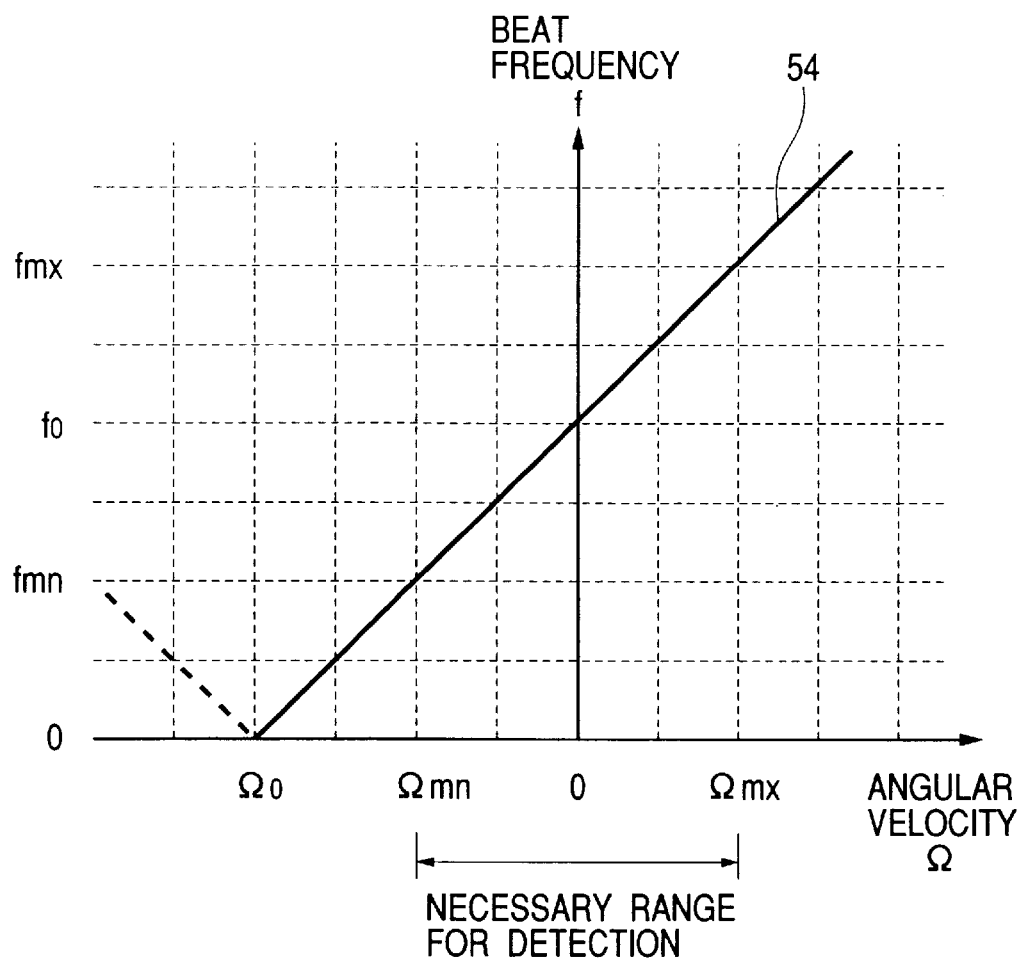
FIG. 14 is a graph showing the relation between the angular velocity applied to the gyro and the frequency of a beat voltage.

A ring laser gyro used in an angular velocity detecting apparatus according to a first embodiment is a ring laser gyro similar to that of FIG. 12. In the first embodiment, an angular velocity detecting apparatus in which it is necessary to effect the detection of an angular velocity in the range of −120 to +120 degrees/sec. at resolution of the order of 0.5 degree/sec. at each interval of 1 msec. will hereinafter be described as an example.

The characteristic of the gyro in the first embodiment can be made into the beat frequency $f_0$=2 MHz when, for example, the angular velocity is 0, by the contrivance of the shape of a tapered portion 11 and the optimization of the value of a power source current. When this beat frequency $f_0$ is higher than necessary, the electric current consumed by a circuit becomes great, and in some cases, this is not preferable in a battery-driven compact apparatus.

Also, by the length of a side of the gyro being 20 cm, the amount of change in the beat frequency per unit angular velocity becomes greater, and it is possible to obtain a gyro having the characteristic that the beat frequency fmn=1.338 MHz when the angular velocity is $\Omega$mn=−120 degrees/sec., and the beat frequency fmx=2.662 MHz when the angular velocity is $\Omega$mx=+120 degrees/sec. This gyro characteristic sufficiently satisfies the condition that in the entire area of the necessary range for the detection of the above-mentioned angular velocity, the beat frequency should be higher than at least 1 kHz.

Figure 1:
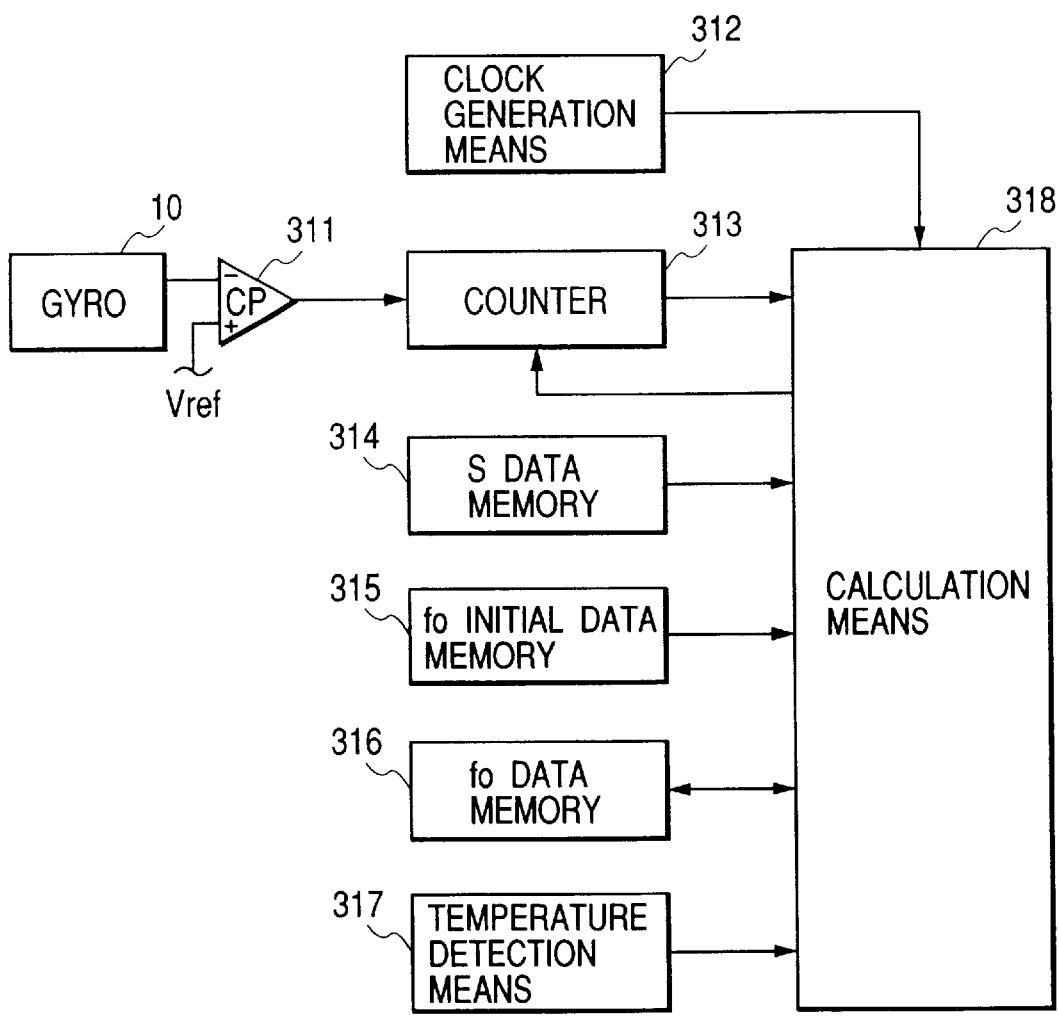
FIG. 1 is a block diagram of an angular velocity detecting apparatus according to a first embodiment of the present invention.

FIG. 1 shows a specific example of the circuit construction of an angular velocity detecting apparatus for detecting a beat frequency output from a ring laser gyro at its terminal voltage so as to obtain angular velocity information. The angular velocity detecting apparatus comprises the following construction including a ring laser gyro 10.

A comparator 311 compares the terminal voltage of the ring laser gyro 10 inputted to the negative input terminal thereof with a voltage Vref inputted to the positive input terminal thereof and outputs a pulse waveform obtained thereby to the output terminal thereof.

Clock generation means 312 comprises an oscillation circuit and a frequency dividing circuit, and generates a clock of 1 kHz for sampling and outputs it to calculation means 318 which will be described later. A counter 313 counts the number of the rising edges or falling edges of the pulse waveform outputted by the comparator 311. The reference numeral 314 designates a memory storing therein data regarding the sensitivity of the gyro 10, and the reference numeral 315 denotes a memory storing therein initial value data regarding the beat frequency at the angular velocity 0 of the gyro 10, and the respective data are read by the calculation means 318 which will be described later.

The reference numeral 316 designates a memory storing therein data regarding the beat frequency at the angular velocity 0 of the gyro 10, and the data is read and written by the calculation means 318 which will be described later.

The reference numeral 317 denotes temperature detection means which outputs information regarding the temperature of the operation environment of the gyro 10 to the calculation means 318 which will be described later. The calculation means 318 is comprised, for example, of a microcomputer or the like, and operates in accordance with the clock generated by the clock generation means 312, and calculates the angular velocity based on information outputted by the counter 313, the memory 314, the memory 315, the memory 316 and the temperature detection means 317. Specifically, it effects the following calculation.

The beat frequency f represented by a straight line 54 is expressed by expression (9).

$$f = S \times \Omega + f_0, \quad (9)$$

where S is the inclination of the straight line 54 and represents the amount of change in the beat frequency per unit angular velocity and can therefore be said to be the sensitivity of the gyro. From expression (9), the angular velocity $\Omega$ is expressed by expression (10).

$$\Omega = (f - f_0) \div S \quad (10)$$

According to expression (10), if the current beat frequency f outputted by the gyro 10, the beat frequency $f_0$ outputted by the gyro 10 in the state of the angular velocity 0 and the sensitivity S of the gyro 10 can be known, the calculation means 318 can calculate the angular velocity $\Omega$ the gyro now receives.

The calculation means 318 reads the count data of the counter 313 at 1 msec. each in accordance with the clock of 1 kHz generated by the clock generation means 312. When the reading is effected, the count data of the counter 313 is reset. Consequently, the count data read here is a beat frequency component appearing at the terminal of the gyro for 1 msec.

In the case of the gyro having the characteristic as described above that the beat frequency $f_0$=2 MHz when the angular velocity is 0, and the beat frequency fmn=1.338 MHz when the angular velocity is $\Omega$mn=−120 degrees/sec., and the beat frequency fmx=2.662 MHz when the angular velocity is $\Omega$mn=+120 degrees/sec., the beat frequency fmn=1.338 MHz when the angular velocity is $\Omega$mn=−120 degrees/sec. and the beat frequency f=1.340 MHz when the angular velocity is $\Omega$=−119.5 degrees/sec. When the beat frequency fmn=1.338 MHz, the count data for 1 msec. is 1338 counts, and when the beat frequency f=1.340 MHz, the count data for 1 msec. is 1340 counts and therefore, in the sampling at 1 msec. each, it is possible to give an angular velocity difference of 0.5 degree/sec. as resolution. If the count data for 1 msec. is increased by 1000 times, it can be converted into frequency information of Hz unit.

Since the information of the sensitivity S stored in the memory 314 is 5.516 kHz (degrees/sec.) in the above-described ring laser gyro, this information can be stored. Generally, however, industrial products have individual irregularities in manufacture, and the sensitivity S also creates an individual irregularity due to such factors as the dimensional error of the ring laser gyro and the error of the oscillation frequency of the laser. When such an individual irregularity cannot be allowed in the detection of the angular velocity, it is desirable that the information of the sensitivity S stored in the memory 314 be stored while being made different in its value for each individual or each layer.

Since the initial value data regarding the beat frequency at the angular velocity 0 which is stored in the memory 315 is $f_0$=2 MHz in the above-described ring laser gyro, this information can be stored. However, as in the case of the sensitivity S, this value also creates an individual irregularity due to such factors as the dimensional error of the ring laser gyro and the error of the driving electric current and therefore, when such an individual irregularity cannot be allowed in the detection of the angular velocity, it is desirable that the information of the initial value data regarding the beat frequency at the angular velocity 0 which is stored in the memory 315 be stored while being made different in the value thereof for each individual or each other.

As regards the data regarding the beat frequency at the angular velocity 0 which is stored in the memory 316, the average value data of beat frequencies actually detected from the ring laser gyro during a predetermined time is found by the calculation means 318 and this is stored. Such data is stored in order to make accurate angular velocity detection possible even when relative to the initial value data regarding the beat frequency at the angular velocity 0 which is stored in the memory 315, there is a change with time in the beat frequency data at the angular velocity 0 indicated by the actual gyro or there is a change by the operation environment or the like. Generally, it is considered that when angular velocities are detected for a predetermined time or longer under such conditions of use that a gyro like the hand vibration detecting mechanism of a camera receives a random angular velocity, and the average value thereof is found, the result becomes substantially the angular velocity 0. Consequently, it is considered that the average value data of beat frequencies actually detected from the ring laser gyro during a predetermined time becomes substantially the data regarding the beat frequency at the angular velocity 0.

When the detection of the angular velocity is started, the calculation means 318 effects calculation in accordance with expression (10) with the data inputted from the counter 313 at 1 msec. each in accordance with the clock generated by the clock generation means 312 as f, the data stored in the memory 314 as S, and the data stored in the memory 315 as $f_0$, and calculates the angular velocity $\Omega$. Also, in parallel to the calculation according to expression (10), it effects the addition of the data inputted from the counter 313 at 1 msec. each. When for example, addition corresponding to 1000 times is effected, the average beat frequency for a second is found and therefore, this is stored in the memory 316 as the data regarding the beat frequency at the angular velocity 0. During the storage, data divided by 1000 may be used to make data in 1 msec.

When the data regarding the beat frequency at the angular velocity 0 is stored in the memory 316, calculation is effected in accordance with expression (10) and the angular velocity $\Omega$ is calculated with the data stored in the memory 316 instead of the data stored in the memory 315 as $f_0$. However, when the data stored in the memory 316 differs by a predetermined amount from the data stored in the memory 315, reliability is regarded as being low and the data stored in the memory 315 is used for calculation. When the amount of change in the data of the sensitivity S and the initial value data regarding the beat frequency at the angular velocity 0 by the environmental temperature cannot be neglected, it is necessary to correct these data in accordance with temperature data outputted by the temperature detection means 317. The correction may be effected in calculation by the calculation means, or the data of the sensitivity or the initial value data regarding the beat frequency at the angular velocity 0 may be classified at each temperature and be stored.

Second Embodiment

Figure 2:
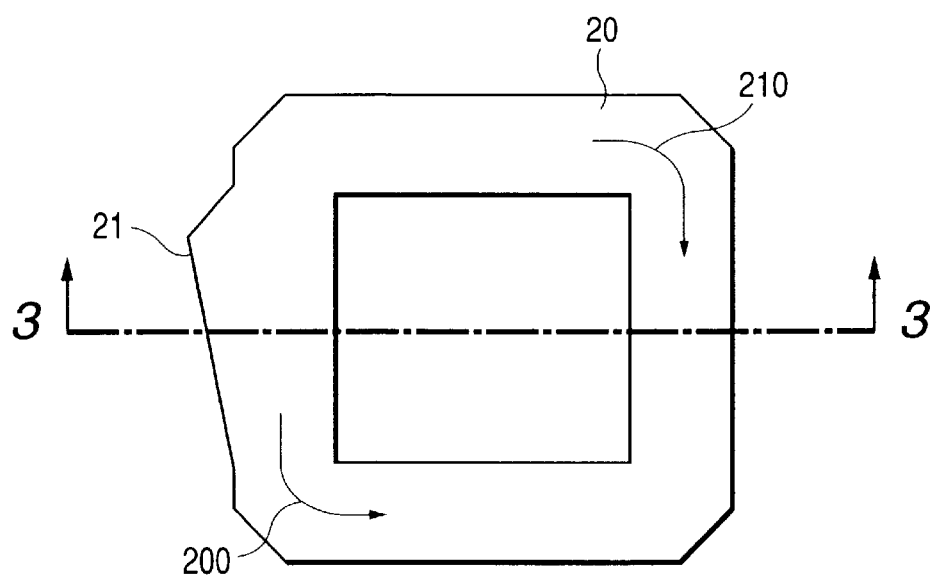
FIG. 2 is a plan view of a ring laser gyro used in an angular velocity detecting apparatus according to a second embodiment of the present invention.

FIG. 2 is a plan view of a ring laser gyro used in an angular velocity detecting apparatus according to a second embodiment of the present invention.

Figure 3:
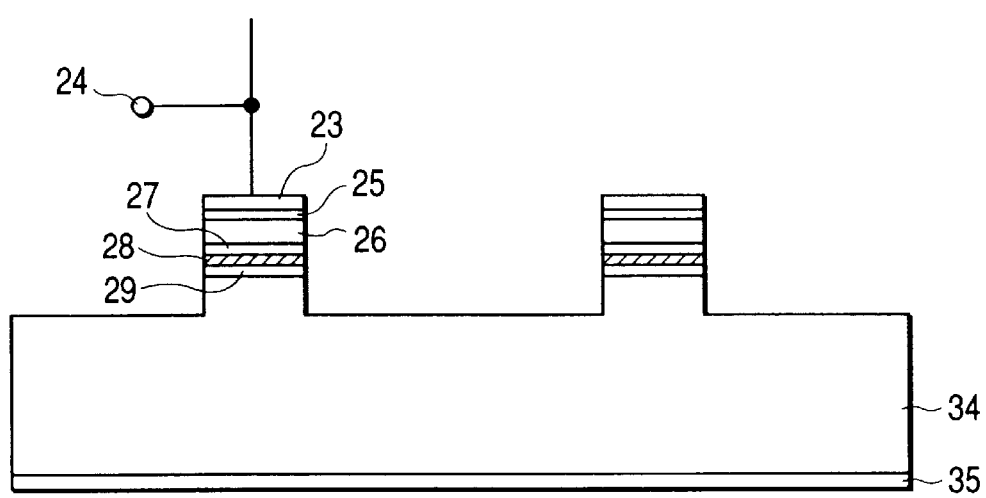
FIG. 3 is a cross-sectional view of the ring laser gyro of FIG. 2 taken along the line 3—3 of FIG. 2.

FIG. 3 is a cross-sectional view taken along the line 3—3 of FIG. 2.

In FIGS. 2 and 3, the reference numeral 20 designates a ring resonator type semiconductor laser, the reference numeral 21 denotes the asymmetrical tapered portion of a light waveguide, the reference numeral 23 designates an anode, the reference numeral 24 denotes an electrical terminal, the reference numeral 25 designates a cap layer, the reference numeral 26 denotes a clad layer, the reference numeral 27 designates a light guide layer, the reference numeral 28 denotes an active layer, the reference numeral 29 designates a light guide layer, the reference numeral 34 denotes a semiconductor substrate, the reference numeral 35 designates a cathode, the reference numeral 200 denotes a counter-clockwise laser beam, and the reference numeral 210 designates a clockwise laser beam.

A manufacturing method in the above-described construction will now be described. First, by the use of the organic metal vapor phase growing method, an undoped InGaAsP light guide layer 29 of 1.3 $\mu$m composition (thickness 0.15 $\mu$m), an undoped InGaAsP active layer 28 of 1.55 $\mu$m composition (thickness 0.1 $\mu$m), an undoped InGaAsP light guide layer 27 of 1.3 $\mu$m composition (thickness 0.15 $\mu$m), a p-InP clad layer 26 (thickness 2 $\mu$m) and a p-InGaAsP cap layer 25 of 1.4 $\mu$m composition (thickness 0.3 $\mu$m) constituting the ring resonator type semiconductor laser 20 are grown on an n-InP substrate 34 (thickness 350 $\mu$m). After the growth of the crystal, by the use of a spin coater, photoresist AZ-1350 (produced by Hekist) is applied onto a p-InP cap layer so that the film thickness thereof may be 1 $\mu$m. Prebaking was effected at 80° C. for 30 minutes, whereafter a wafer was exposed with a mask applied thereon. The width of the light waveguide after development and rinse is 5 $\mu$m.

Thereafter, the wafer was introduced into a reactive ion etching apparatus, and was etched by the use of chlorine gas so that the depth thereof might be 3 $\mu$m.

Lastly, Cr/Au was formed as the anode 23 on the p-InP cap layer 25 by vapor deposition. Also, AuGe/Ni/Au was vapor-deposited as the cathode 35 on the n-InP substrate. Thereafter, it was annealed in hydrogen atmosphere, and ohmic contact was taken.

In the above-described construction, reflection occurs on the interface because the semiconductor and air differ in refractive index from each other. When it is assumed that the refractive index of the semiconductor is 3.5, total reflection occurs when the angle formed between the normal to the interface and the laser beam is 16.6° or greater.

In a mode subjected to total reflection, as compared with the other modes, the oscillation threshold value becomes smaller by an amount corresponding to mirror loss and therefore, oscillation starts at a low injection current level. Moreover, the gain concentrates in this oscillation mode and therefore, the oscillation in the other modes is restrained.

The angle formed between the normal to the interface and the laser beam is 45° and satisfies a total reflection condition. The oscillation threshold value at room temperature is 3 mA for the laser beam 200, and 3.5 mA for the laser beam 210.

In the second embodiment, an angular velocity detecting apparatus in which it is necessary to effect the detection of an angular velocity in the range of −20 to +20 degrees/sec. at resolution of the order of 0.1 degree/sec. at each interval of 1 msec. will hereinafter be described as an example.

Again in the second embodiment, by the contrivance of the shape of the tapered portion 21 and the optimization of the value of the power source current, for example, the beat frequency $f_0$ when the angular velocity is 0 can be made into $f_0$=2 kHz.

Also, by the length of a side of the gyro being made equal to 300 $\mu$m, the amount of change in the beat frequency per unit angular velocity becomes greater, and the beat frequency $f_0$=2 kHz when the angular velocity is 0, and the beat frequency fmn=1.93244 kHz when the angular velocity is $\Omega$mn=−20 degrees/sec., and the beat frequency fmn= 2.06756 kHz when the angular velocity is $\Omega$mn=+20 degrees/sec.

Figure 4:
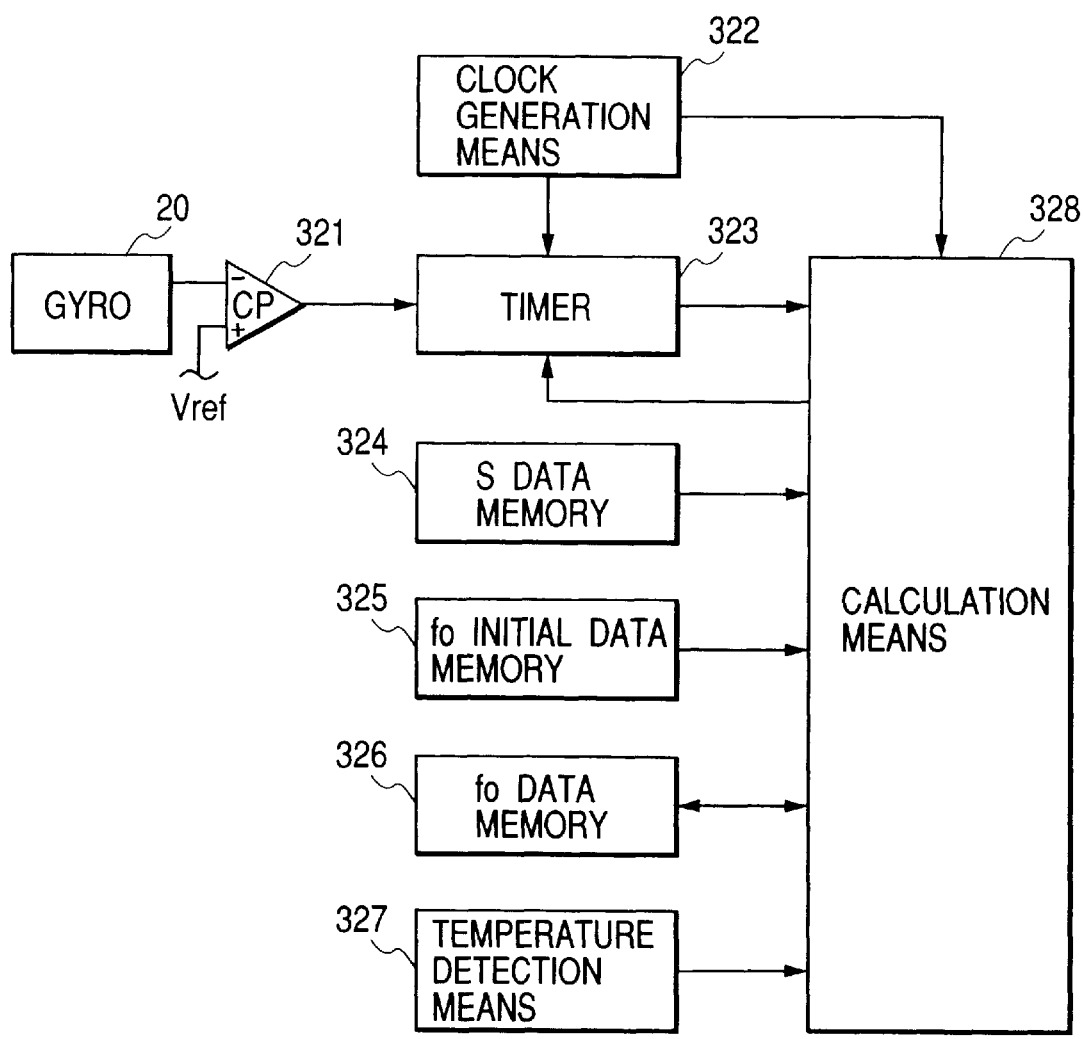
FIG. 4 is a block diagram of the angular velocity detecting apparatus according to the second embodiment of the present invention.

FIG. 4 shows a specific example of the circuit construction of the angular velocity detecting apparatus according to the second embodiment. The angular velocity detecting apparatus comprises the following construction including a ring laser gyro 20.

A comparator 321 compares the terminal voltage of the ring laser gyro 20 inputted to the negative input terminal thereof with a voltage Vref inputted to the positive input terminal and outputs a pulse waveform obtained thereby to the output terminal thereof.

Clock generation means 322 comprises an oscillation circuit and a frequency dividing circuit or the like, and generates a clock of 1 kHz for sampling and outputs it to calculation means 328 which will be described later, and also generates a clock of 20 MHz for measurement and outputs it to a timer 323 which will be described later. The timer 323 measures the number of the clocks of 20 MHz at each time interval of the rising edge or the falling edge of the pulse waveform outputted by the comparator 321.

The reference numeral 324 designates a memory storing therein data regarding the sensitivity of the gyro 20, and the reference numeral 325 denotes a memory storing therein initial value data regarding the beat frequency at the angular velocity 0 of the gyro 20, and the respective data are read by the calculation means 328 which will be described later. The reference numeral 326 designates a memory storing therein data regarding the beat frequency at the angular velocity 0 of the gyro 20, and the data is read and written by the calculation means 328 which will be described later. The reference numeral 327 denotes temperature detection means which outputs information regarding the temperature of the operation environment of the gyro 20 to the calculation means 328 which will be described later.

The calculation means 328 is comprised, for example, of a microcomputer or the like, and operates in accordance with the clock generated by the clock generation means 322, and calculates an angular velocity from information outputted by the timer 323, the memory 324, the memory 325, the memory 326 and the temperature detection means 327. Specifically, it effects the calculation as described below.

The basic expression for calculating the angular velocity $\Omega$ is the same as expression (10) shown in the first embodiment.

The calculation means 328 reads the count data of the timer 323 at 1 msec. each in accordance with the clock of 1 kHz generated by the clock generation means 322. The count data outputted from the timer 323 is data regarding the time of the latest cycle of the beat frequency outputted by the gyro 20. When as previously described, the beat frequency fmx=2.06756 kHz when the angular velocity is $\Omega$mn=+20 degrees/sec., the cycle count data of the timer 323 which is 20 MHz as the clock for measurement is 9673, and the cycle count data of the timer 323 at the beat frequency f=2.06722 kHz when the angular velocity is $\Omega$=+19.9 degrees/sec. is 9674 and therefore, in this case, it is possible to give an angular velocity difference of 0.1 degree/sec. as resolution. By carrying out the converting process of multiplying the inverse number of such cycle count data by 20000000, the cycle count data can be converted into frequency information of Hz unit. Since the information of the sensitivity S stored in the memory 324 is 3.378 Hz/(degrees/sec.) in the above-described ring laser gyro, this information can be stored. Generally, however, industrial products have individual irregularities in manufacture, and the sensitivity S also creates an individual irregularity due to such factors as the dimensional error of the ring laser gyro and the error of the oscillation frequency of the laser. When such an individual irregularity cannot be allowed in the detection of the angular velocity, it is desirable that the information of the sensitivity S stored in the memory 324 be stored while being made different for each individual or each layer.

Since the initial value data regarding the beat frequency at the angular velocity 0 which is stored in the memory 325 is $f_0$=2 kHz in the above-described ring laser gyro, this information can be stored. However, as in the case of the sensitivity S, this value also creates an individual irregularity due to such factors as the dimensional error of the ring laser gyro and the error of the driving current and therefore, when such an individual irregularity cannot be allowed in the detection of the angular velocity, it is desirable that the information of the initial value data regarding the beat frequency at the angular velocity 0 which is stored in the memory 325 be stored with its value made different for each individual or each layer.

As regards the data regarding the beat frequency at the angular velocity 0 which is stored in the memory 326, the average value data of the beat frequencies actually detected from the ring laser gyro during a predetermined time is found by the calculation means 328 and this is stored. Such data is stored in order to make accurate angular velocity detection possible even when relative to the initial value data regarding the beat frequency at the angular velocity 0 which is stored in the memory 325, there is a change with time in the beat frequency data at the angular velocity 0 indicated by the actual gyro or there is a change by the operation environment or the like. Generally, it is considered that when angular velocities are detected for a predetermined time or longer under such conditions of use that a gyro like the hand vibration detecting mechanism of a camera receives a random angular velocity and the average value thereof is found, the result is substantially the angular velocity 0. Consequently, it is considered that the average value data of the beat frequencies actually detected from the ring laser gyro during a predetermined time is substantially data regarding the beat frequency at the angular velocity 0.

When the detection of the angular velocity starts, the calculation means 328 effects calculation in accordance with expression (10) as in the first embodiment with the inverse number data of the cycle data inputted from the timer 323 at 1 msec. each in accordance with the clock generated by the clock generation means 322 as f, the data stored in the memory 324 as S, and the data stored in the memory 325 as $f_0$, and calculates the angular velocity $\Omega$. Also, in parallel to the calculation according to expression (10), it effects the addition of the data inputted from the timer 323 at 1 msec. each. For example, if addition corresponding to 1000 times is effected and thereafter the result is divided by 1000, the average beat frequency for one second is found and therefore, this is stored in the memory 326 as the data regarding the beat frequency at the angular velocity 0. During the storage, either of the cycle data and the frequency data having taken the inverse number thereof may be used for the convenience of the calculation process.

When the data regarding the beat frequency at the angular velocity 0 is stored in the memory 326, the calculation means effects calculation in accordance with expression (10) with the data stored in the memory 326 instead of the data stored in the memory 325 as $f_0$, and calculates the angular velocity $\Omega$. However, when the data stored in the memory 326 differs by a predetermined amount or greater from the data stored in the memory 325, it is regarded as being low in reliability and the data stored in the memory 325 is used.

When the amount of change in the data of the sensitivity S and the initial value data regarding the beat frequency at the angular velocity 0 by the enrivonmental temperature cannot be neglected, it is necessary as in the first embodiment to correct these data in accordance with temperature data outputted by the temperature detection means 327.

Third Embodiment

While in the second embodiment, the data regarding the beat frequency at the angular velocity 0 which is stored in the memory 326 is the average value of the addition corresponding to 1000 times of the data inputted from the timer 323 at 1 msec. each, this system is not restrictive.

Figure 5:
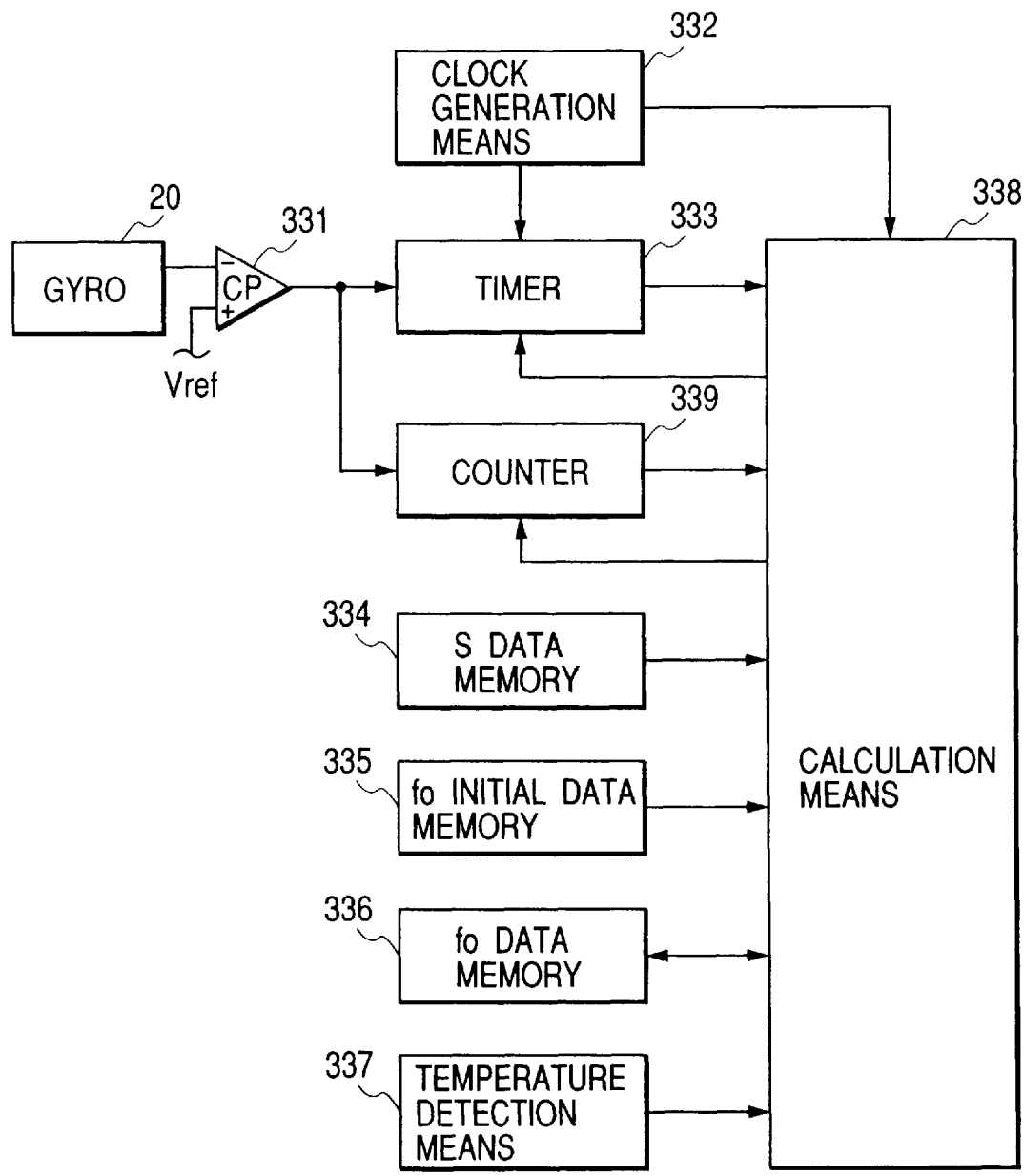
FIG. 5 is a block diagram of an angular velocity detecting apparatus according to a third embodiment of the present invention.

FIG. 5 shows a specific example of the circuit construction of an angular velocity detecting apparatus partly differing in circuit construction from the second embodiment.

That is, an angular velocity detecting apparatus according to a third embodiment of the present invention comprises the following construction including a ring laser gyro 20.

A comparator 331 compares the terminal voltage of the ring laser gyro 20 inputted to the negative input terminal thereof with a voltage Vref inputted to the positive input terminal thereof and outputs a pulse waveform obtained thereby to the output terminal thereof.

Clock generation means 332 comprises an oscillation circuit and a frequency dividing circuit or the like, and generates a clock of 1 kHz and a clock of 1 Hz for sampling and outputs them to calculation means 338 which will be described later, and also generates a clock of 20 MHz for measurement and outputs it to a timer 333 which will be described later.

The timer 333 measures the number of the aforementioned clocks of 20 MHz at each time interval of the rising edge or the falling edge of the pulse waveform outputted by the comparator 331.

The reference numeral 334 designates a memory storing therein data regarding the sensitivity of the gyro 20, and the reference numeral 335 denotes a memory storing therein initial value data regarding the beat frequency at the angular velocity 0 of the gyro 20, and the respective data are read by the calculation means 338 which will be described later.

The reference numeral 336 designates a memory storing therein data regarding the beat frequency at the angular velocity 0 of the gyro 20, and the data is read and written by the calculation means 338 which will be described later.

The reference numeral 337 denotes temperature detection means which outputs information regarding the temperature of the operation environment of the gyro 20 to the calculation means 338 which will be described later.

The calculation means 338 is comprised, for example, a microcomputer or the like, and operates in accordance with the clock generated by the clock generation means 332, and calculates an angular velocity from information outputted by the timer 333, the memory 334, the memory 335, the memory 336, the temperature detection means 337 and a counter 339 which will be described later. The counter 339 counts the number of the rising edges or the falling edges of the pulse waveform outputted by the comparator 331.

The calculation means 338 specifically effects the calculation as described below.

The basic expression for calculating the angular velocity $\Omega$ is the same as the expression (10) shown in the first embodiment. The calculation means 338 reads the count data of the timer 333 at 1 msec. each in accordance with the clock of 1 kHz generated by the clock generation means 332. The count data outputted from the timer 333, as in the second embodiment, is data regarding the time of the latest one cycle of the beat frequency outputted by the gyro 20. As in the second embodiment, by carrying out the converting process of multiplying the inverse number of the count data of such periods by 20000000, it can be converted into frequency information of Hz unit.

Since the information of the sensitivity S stored in the memory 334 is 3.378 Hz/(degrees/sec.) in the above-described ring laser gyro, this information can be stored. Generally, however, industrial products have individual irregularities in manufacture, and the sensitivity S also creates an individual irregularity due to such factors as the dimensional error of the ring laser gyro and the error of the oscillation frequency of the laser. When such an individual irregularity cannot be allowed in the detection of the angular velocity, it is desirable that the information of the sensitivity S stored in the memory 334 be stored with the value thereof made different for each individual or each layer.

Since the initial value data regarding the beat frequency at the angular velocity 0 which is stored in the memory 335 is $f_0=2$ kHz in the above-described ring laser gyro, this information can be stored. However, as in the case of the sensitivity S, this value also creates an individual irregularity due to such factors as the dimensional error of the ring laser gyro and the error of the driving current and therefore, when such an individual irregularity cannot be allowed in the detection of the angular velocity, it is desirable that the information of the initial value data regarding the beat frequency at the angular velocity 0 which is stored in the memory 335 be stored with the value thereof made different for each individual or each layer.

As regards the data regarding the beat frequency at the angular velocity 0 which is stored in the memory 336, the average value data of the beat frequencies actually detected from the ring laser gyro during a predetermined time is found by the calculation means 338 and this is stored.

When the detection of the angular velocity starts, the calculation means 338 effects calculation in accordance with expression (10) as in the first and second embodiments with the inverse number data of the cycle data inputted from the timer 333 at 1 msec. each in accordance with the clock generated by the clock generation means 332 as f, the data stored in the memory 334 as S, and the data stored in the memory 335 as $f_0$, and calculates the angular velocity $\Omega$. Also, it inputs the data of pulse number from the counter 339 at each one second in accordance with the clock of 1 Hz outputted by the clock generation means 332. Since this pulse number data is the average beat frequency of the gyro 20 for one second, this is stored in the memory 336 as the data regarding the beat frequency at the angular velocity 0. By doing this, it becomes unnecessary for the calculation means 338 to find the addition average value as in the second embodiment.

When the data regarding the beat frequency at the angular velocity 0 is stored in the memory 336, the calculation means effects calculation in accordance with expression (10) with the data stored in the memory 336 instead of the data stored in the memory 335 as $f_0$, and calculates the angular velocity $\Omega$. However, when the data stored in the memory 336 differs by a predetermined amount or greater from the data stored in the memory 335, it is regarded as being low in reliability and the data stored in the memory 335 is used for the calculation.

When the amount of change in the data of the sensitivity S and the initial value data regarding the beat frequency at the angular velocity 0 by the environmental temperature cannot be neglected, it is necessary as in the first or second embodiment to correct these data in accordance with temperature data outputted by the temperature detection means 337.

Example of Application

Figure 6:
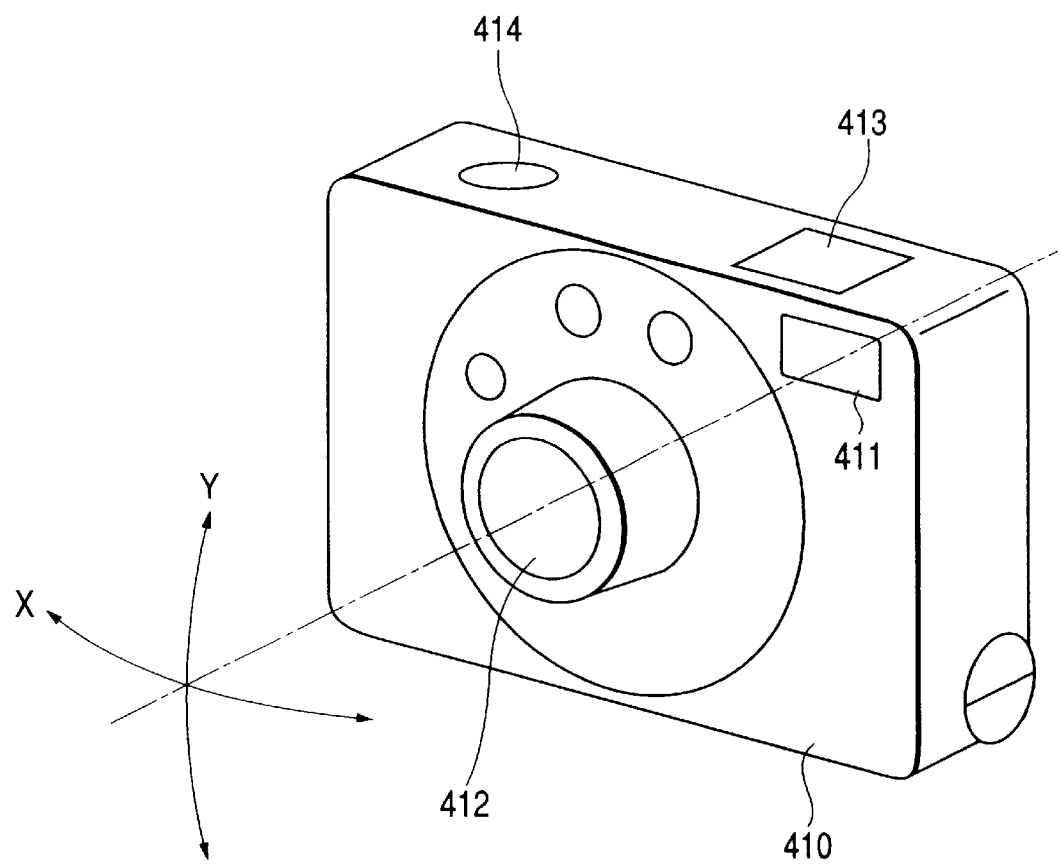
FIG. 6 is a perspective view of a camera incorporating the angular velocity detecting apparatus of the present invention therein.

FIG. 6 is a perspective view of a still camera having the hand vibration preventing function and incorporating therein the ring laser gyro and the angular velocity detecting apparatus using the ring laser gyro which have been described in the first to third embodiments. The reference numeral 410 designates the camera, the reference numeral 411 denotes a flashlight emitting portion, the reference numeral 412 designates a photo-taking lens, the reference numeral 413 denotes an indicator, and the reference numeral 414 designates a shutter button, and there is already known the technique of disposing in the camera or in the lens two angular velocity sensors or the like for separating the inclination of the optical axis of the photo-taking lens 412 by hand vibration into two axes, i.e., the X-direction and the Y-direction shown in FIG. 6 and detecting it, and moving the lens forming a part of the photo-taking optical system on the basis of the result of the detection to thereby prevent the deterioration of an image by hand vibration.

Figure 7A:
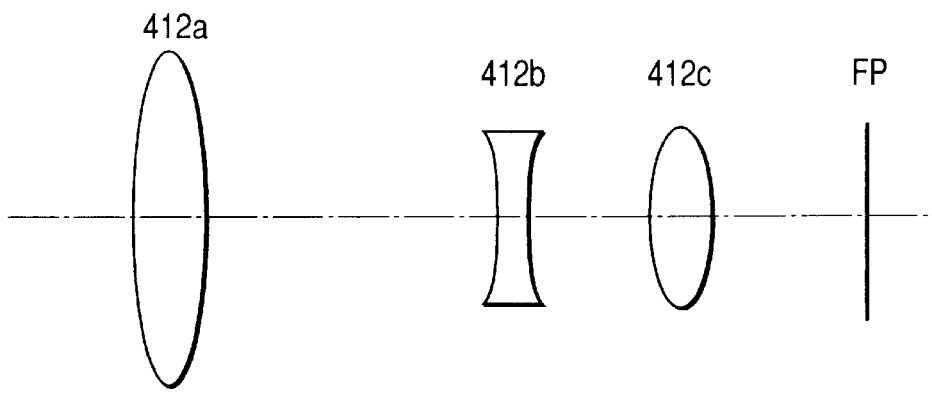
FIGS. 7A, 7B and 7C are optical path views for illustrating the hand vibration correction of the camera of FIG. 6.
Figure 7B:
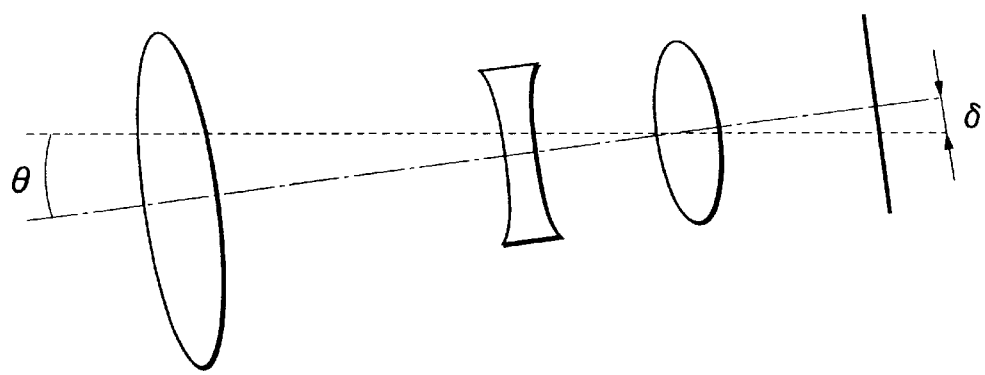
Figure 7C:
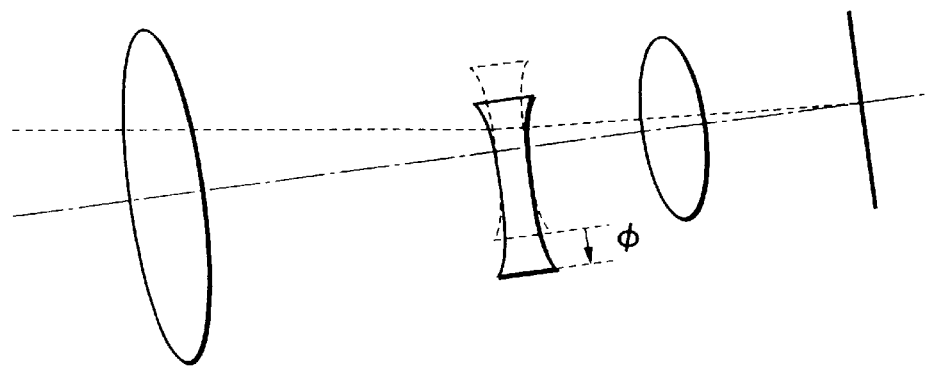

FIGS. 7A, 7B and 7C illustrate a photo-taking lens having a hand vibration preventing mechanism.

FIG. 7A shows a state in which there is no hand vibration, and the photo-taking lens has, in succession from the object side, a first lens unit 412a, a second lens unit 412b and a third lens unit 412c, and FP designates a film surface. The second lens unit is an optical system called a blur correction system movable in a direction perpendicular to the optical axis.

FIG. 7B shows a state in which hand vibration occurs, and the optical axis is inclined by an angle θ, whereby image blur δ occurs on the film surface.

FIG. 7C shows a state in which the hand vibration which has occurred is corrected, and shows that the second lens unit shifts by ψ to thereby correct the image blur δ.

FIGS. 7A, 7B and 7C show only one axis, but if the photo-taking lens has such detection system and correction system with respect to two axes, i.e., the X-direction and the Y-direction.

Figure 8:
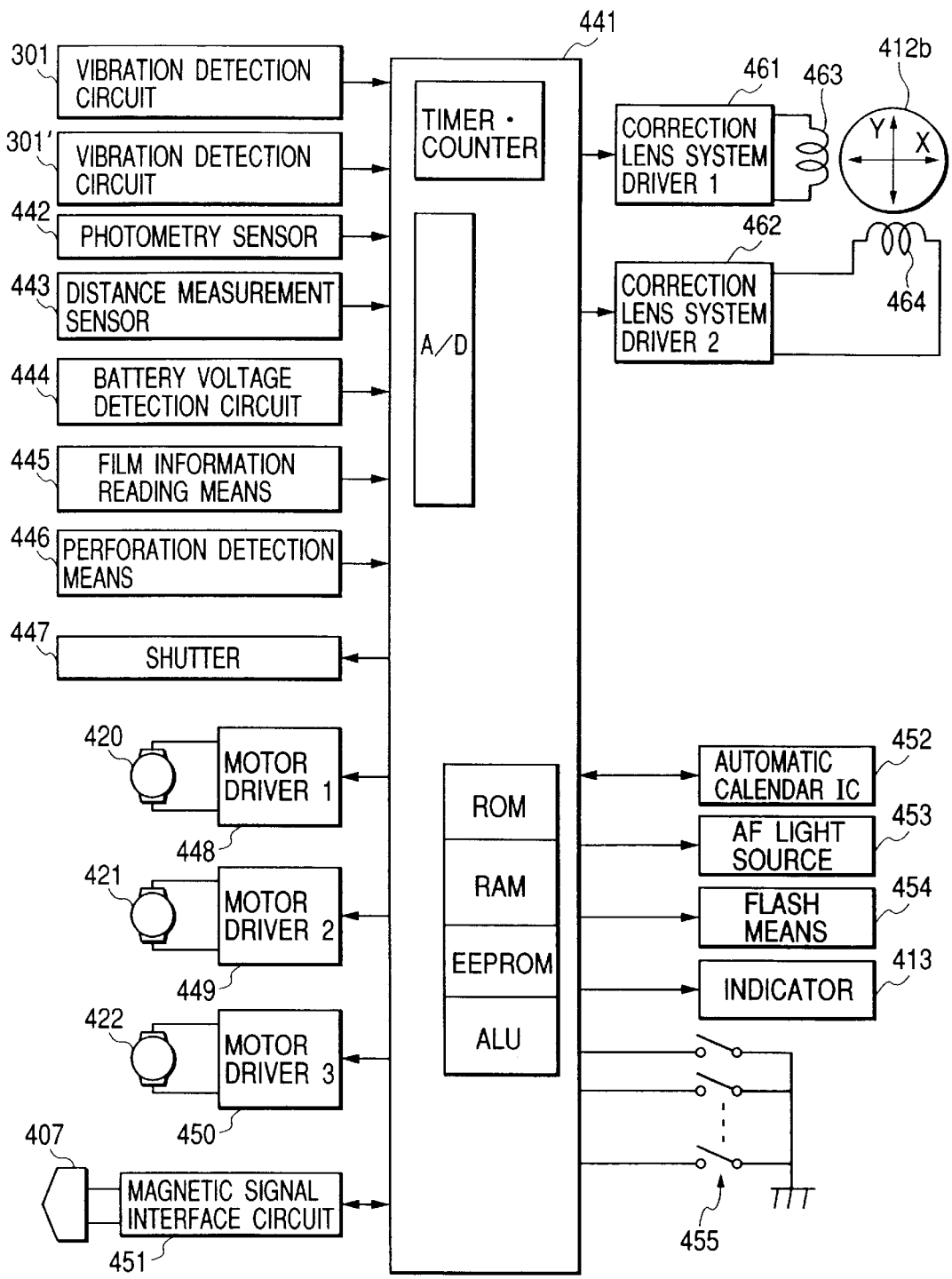
FIG. 8 is a block diagram of a circuit used in the camera of FIG. 6.

FIG. 8 is a block diagram showing an example of the construction of the electric circuit of the camera in this example of application.

The reference numeral 441 designates control means comprising a microcomputer or the like containing therein, for example, ALU, ROM, RAM, EEPROM, a timer-counter and an A/D converter, and this control means 441 effects the general control of a camera mechanism or the like including hand vibration correction. The specific control sequence of the control means 441 will be described later. The reference numeral 442 denotes a photometry sensor for obtaining the luminance information of an object, and the photometry sensor 442 is comprised, for example, of a photodiode and an amplifier for amplification or the like and is connected to the input terminal of the A/D converter of the control means 441. The reference numeral 443 designates a distance measurement sensor for obtaining information regarding the distance to the object, and the distance measurement sensor 443 is comprised of a sensor portion such as a PSD or a CCD and the signal processing portion thereof or the like and is also connected to the input terminal of the A/D converter of the control means 441. The reference numeral 444 denotes a battery voltage detection circuit which outputs information regarding the voltage of a battery which is the power source of the camera, and is connected to the input terminal of the A/D converter of the control means 441. The reference numeral 445 designates film information reading means for reading film information provided on a film cartridge, and the film information reading means 445 comprises, for example, a photoreflector or the like and the output thereof is connected to the input terminal of the A/D converter of the control means 441. The reference numeral 446 denotes perforation detection means for detecting the perforations of the film, and the perforation detection means 446 comprises, for example, a photoreflector or the like and the output thereof is connected to the input terminal of the A/D converter of the control means 441.

The reference numeral 447 designates a shutter which is connected to the output terminal of the control means 441 and is controlled thereby. The reference numeral 448 denotes a first motor driver which is connected to the output terminal of the control means 441 and is controlled thereby, and drives a first motor 420 for effecting the winding-up and rewinding of the film. The reference numeral 449 designates a second motor driver which is connected to the output terminal of the control means 441 and is controlled thereby, and drives a second motor 421 for effecting the opening and closing of the light intercepting cover (not shown) of the film cartridge. The reference numeral 450 denotes a third motor driver which is connected to the output terminal of the control means 441 and is controlled thereby, and drives a third motor 422 for effecting the focus adjustment of the photo-taking lens.

The reference numeral 451 designates a magnetic signal interface circuit which, when information recording is to be effected on a photographing information recording area on the film, receives the output signal of the control means 441 as an input and gives an optimum recording current conforming to that signal to photographing information input and output means 407. Also, when recorded information is to be reproduced from the photographing information recording area on the film, the magnetic signal interface circuit 451 moderately amplifies the reproduction signal by the photographing information input and output means 407, and effects filtering or waveform shaping or the like as required and outputs the result to the control means 441.

The reference numeral 452 denotes an automatic calendar IC which is comprised of a rock crystal oscillator and a time counting integrated circuit, and automatically counts calendar information such as year, month, day, hour and minute irrespective of the operation of the control means 441. The counted information is connected so that the control means 441 can read out it at any time. The reference numeral 453 designates an AF light source for projecting infrared light or the like onto the object when an attempt is made to obtain the information regarding the distance to the object from the distance measurement sensor 443, and light is emitted therefrom in conformity with the output signal of the control means 441. The reference numeral 454 denotes flash means which emits light during photographing when the luminance of the object is deficient, and light is emitted therefrom in conformity with the output signal of the control means 441. The reference numeral 413 designates an indicator comprising a liquid crystal panel or the like described also in FIG. 9, and the various segments thereof are turned on in conformity with the output signal of the control means 441, whereby the indication of the various kinds of information of the camera is effected. The reference numeral 455 denotes various switches including various operating switches such as a shutter button and a rewinding switch, and detection switches such as a cartridge presence detection switch and a light intercepting cover opening and closing detection switch.

The reference numerals 301 and 301' designate camera vibration detection circuits, and any of the angular velocity detection circuits in the first to third embodiments can be applied thereto. The fluctuation detection circuits 301 and 301' detect the rotational angular velocities in the X-direction and the Y-direction, respectively. However, the control means 441 of the camera can serve also as the calculation means 318, 328, 338 already described. It is usual that the integrated circuit of a microcomputer or the like has memories such as ROM, RAM and EEPROM and the hardware of a timer-counter function and therefore, the control means 441 of the camera can serve also as the memories and timer-counter already described.

The reference numeral 461 designates a first correction lens system driver which is connected to the output terminal of the control means 441 and is controlled thereby and effects the electrical energization of a first correction lens system driving coil 463. When the first correction lens system driving coil 463 is electrically energized, a correction lens system 412*b* is moved in the Y-direction in conformity with the amount of electrical energization. The reference numeral 462 denotes a second correction lens system driver which is connected to the output terminal of the control means 441 and is controlled thereby and effects the electrical energization of a second correction lens system driving coil 464. When the second correction lens system driving coil 464 is electrically energized, the correction lens system 412*b* is moved in the X-direction in conformity with the amount of electrical energization.

Figure 9:
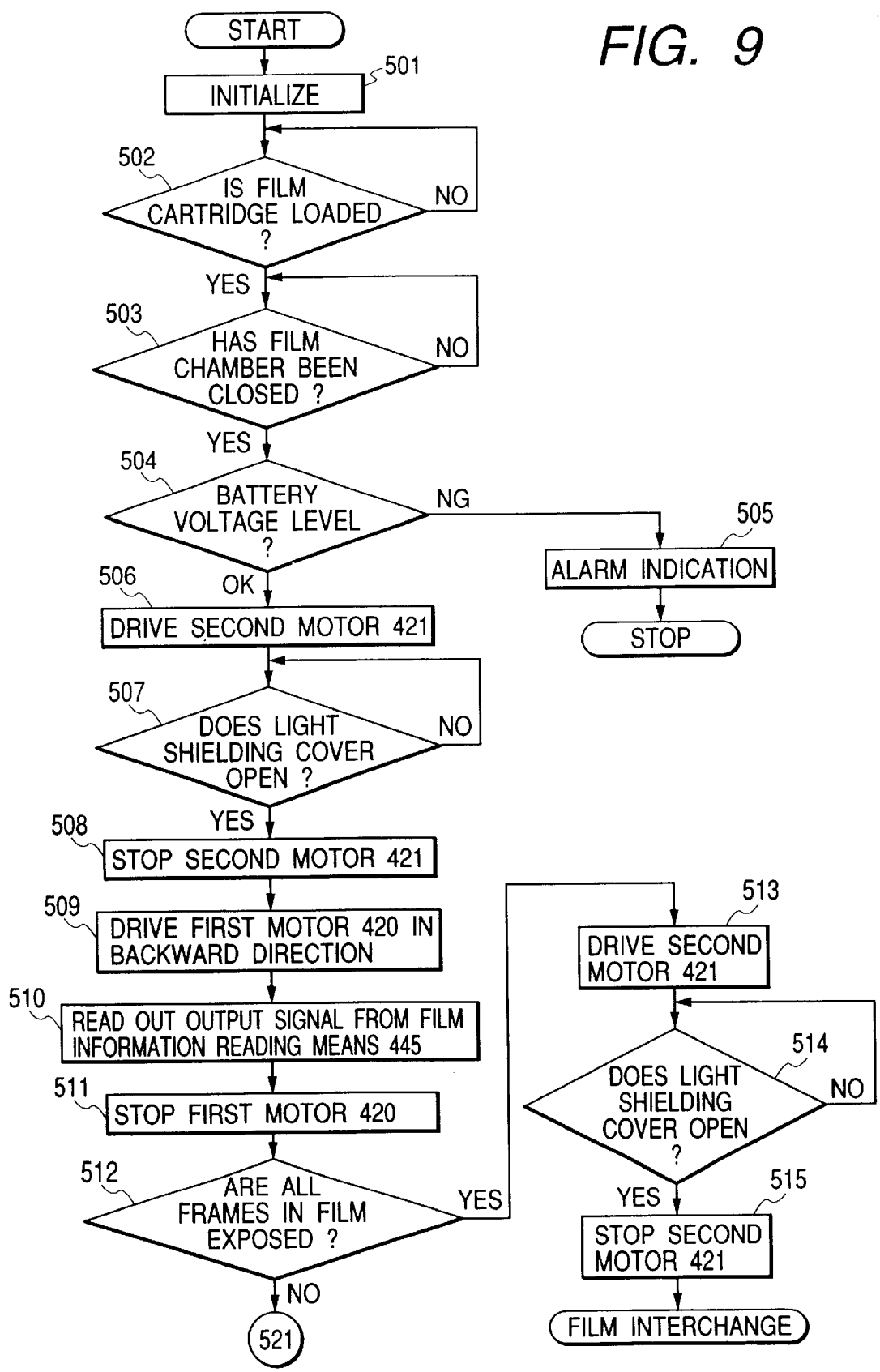
FIG. 9 is a flow chart for illustrating the operation of the control means of the circuit of FIG. 8.

FIG. 9 is a flow chart for illustrating the operation of the control means 441 of the camera. When a power source switch, not shown, is closed and the control means 441 becomes operable, a step (501) is executed.

At (501), the control means 441 effects the initialization of its memories and port.

At (502), the detection of the loading of the film cartridge is effected by the signal of the cartridge presence detection switch (not shown). When the film cartridge is loaded, advance is made to (503).

At (503), the film chamber of the camera being closed is waited for. When the film chamber is closed, advance is made to (504).

At (504), the output signal of the battery voltage detection circuit 444 is A/D-converted and whether the battery voltage is sufficient for the operation of the camera is checked up. If it is judged that the battery voltage is insufficient, advance is made to (505).

At (505), alarm indication for informing that the battery is bad is outputted to the indicator 413 and the operation thereafter is stopped. When the battery is interchanged, (501) and so on are executed again.

If the battery voltage is sufficient, advance is made from (504) to (506).

At (506), a control signal is outputted to the second motor driver 449 so as to drive the second motor 421.

At (507), whether the light intercepting cover of the film cartridge has been opened is detected by the signal of the light intercepting cover opening and closing detection switch (not shown). When it is detected that the light intercepting cover has been opened, advance is made to (508).

At (508), a control signal is outputted to the second motor driver 447 so as to stop the second motor 421.

At (509), a control signal is outputted to the first motor driver 448 so as to drive the first motor 420 in a backward direction. Thereby, the rotation of an information indicating dial (not shown) provided on the film cartridge is started. Since the first motor is being driven in the backward direction, the film is not fed out.

At (510), the output signal of the film information reading means 445 is read. By the read signal being decoded, information such as the kind and sensitivity of the film or information such as the number of exposed frames and the information of the exposed state of the film are obtained.

At (511), a control signal is outputted to the first motor driver 448 so as to stop the first motor 420.

At (512), whether the obtained information of the exposed state of the film is that all frames are exposed is checked up. If all frames are exposed, advance is made to (513).

At (513), a control signal is outputted to the second motor driver 449 so as to drive the second motor 421.

At (514), whether the light intercepting cover has been closed is detected by the signal of the light intercepting cover opening and closing detection switch. When it is detected that the light intercepting cover has been closed, advance is made to (515).

At (515), a control signal is outputted to the second motor driver 449 so as to stop the second motor 421. Thereafter, for the film to be interchanged is waited for.

Figure 10:
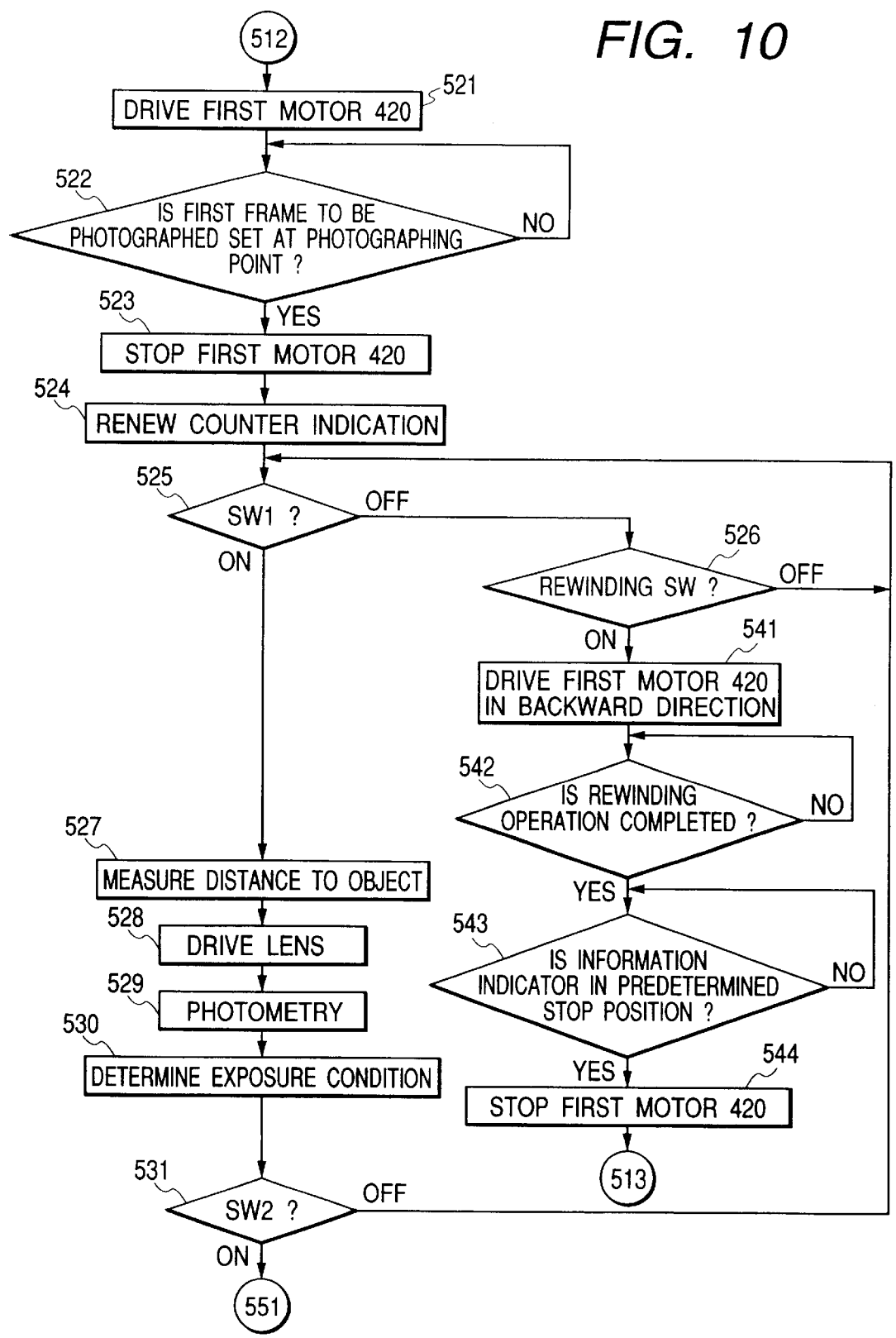
FIG. 10 is a flow chart for illustrating film loading.

FIG. 10 is a flow chart when the information of the exposed state of the film obtained at the step (512) is not that all frames are exposed. When the information is not that all frames are exposed, advance is made to (521), where film loading is executed.

At (521), a control signal is outputted to the first motor driver 448 so as to drive the first motor in a forward direction. Thereby, the feeding-out of the film is started.

At (522), for the first frame in the film to be photographed to be set at a predetermined photographing point in accordance with the signal of the perforation detection means 446 is waited for.

At (523), a control signal is outputted to the first motor driver 448 so as to stop the first motor 420.

At (524), the indication value of the film counter to be indicated on the indication 413 is renewed. Since new film is loaded ow, "1" is indicated.

At (525), whether the switch SW1 adapted to become ON by the first stroke of the shutter button is ON is checked up. If it is not yet ON, advance is made to (526).

At (526), whether the rewinding switch is ON is checked up. If it is not yet ON, return is made to the step (525).

If the switch SW1 is ON, advance is made from (525) to (527).

At (527), information is inputted from the distance measurement sensor 443 to thereby obtain information regarding the distance to the object. Further, an amount of lens driving necessary to bring the photo-taking lens into an in-focus state is calculated in accordance with the obtained information regarding the distance to the object.

At (528), a signal is outputted to the third motor driver 450 so as to drive the focus adjusting lens in accordance with the calculated amount of lens driving, thereby driving the third motor 422.

At (529), information is inputted from the photometry sensor 442 and the luminance information of the object is obtained.

At (530), exposure such as a shutter speed and an aperture value is determined in accordance with the obtained luminance information of the object and the sensitivity information of the film obtained at the step (510). At this time, whether photographing should be done by the use of the flash means 454 is also determined.

At (531), whether the switch SW2 adapted to become ON by the second stroke of the shutter button is ON is checked up. If it is not yet ON, return is made to (525), where the above-described flow is repeated.

When at the aforedescribed step (526), it is detected that the rewinding switch is ON, advance is made to (541).

At (541), a control signal is outputted to the first motor driver 448 so as to drive the first motor 420 in the backward direction. Thereby, the rewinding of the film is started.

At (542), for the film to be completely rewound into the cartridge in accordance with the signal of the perforation detection means 446 is waited for.

At (543), for the information indicator to assume a predetermined stop position is waited for while the output signal of the film information reading means 445 is being read.

At (544), a control signal is outputted to the first motor driver 448 so as to stop the first motor 420. Thereafter, advance is made to the step (513) and subsequent steps of FIG. 12, where the removal of the film is waited for.

Figure 11:
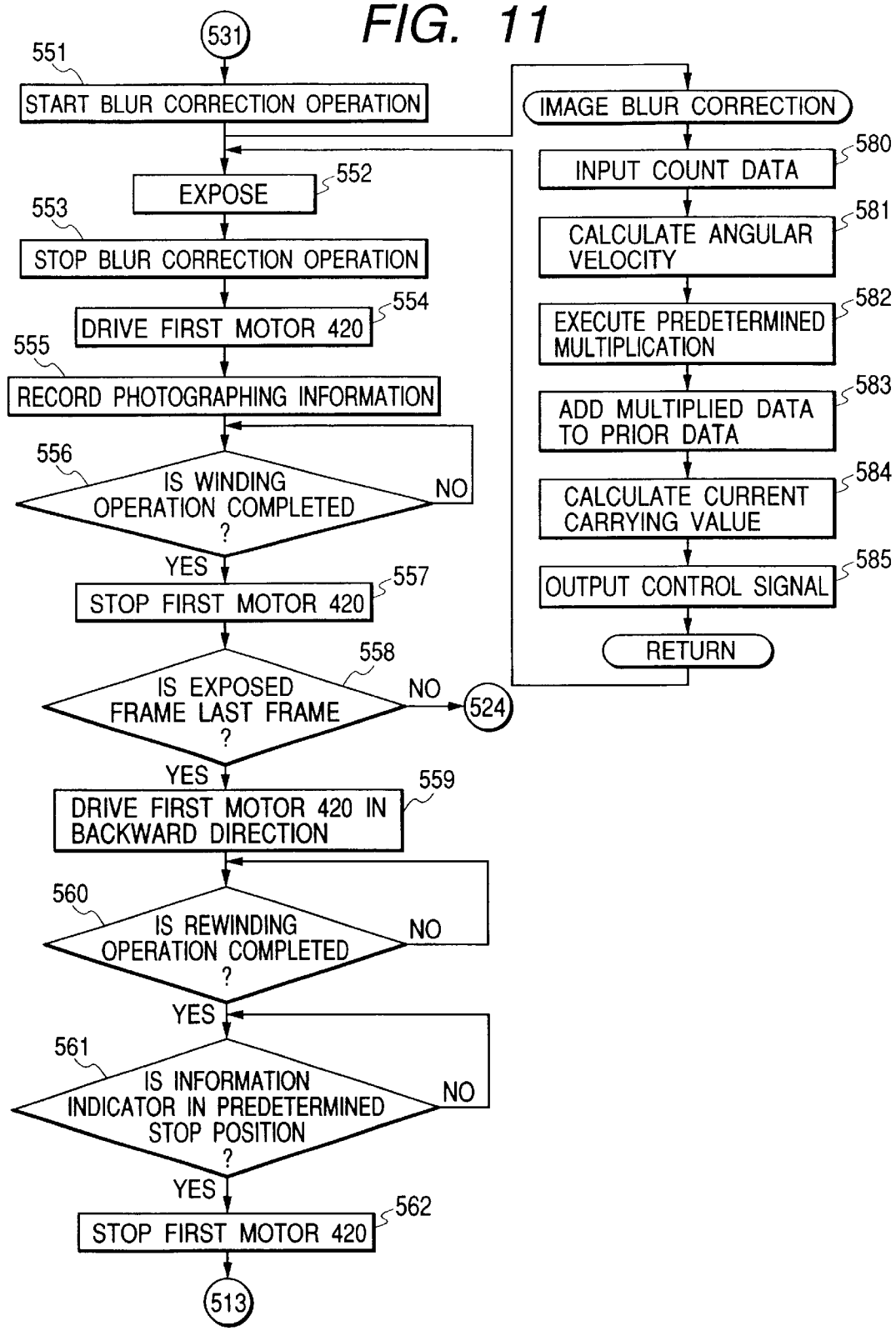
FIG. 11 is a flow chart for illustrating the processing including hand vibration correction.

FIG. 11 is a flow chart when the switch SW2 adapted to become ON by the second stroke of the shutter button is ON at the step (531). When the switch SW2 is ON, advance is made to (551).

At (551), the operation of the processing for blur correction is permitted. The processing for blur correction, as the function of the microcomputer, is carried out at a predetermined cycle such as an interval of 1 msec. by the well-known timer interrupting function. When this timer interruption occurs, (580) is executed.

At (580), the count data regarding the angular velocity outputted by the vibration detection circuits 301 and 301' is inputted from the counter-timer.

At (581), the beat frequency f outputted by the gyro is found from the count data, and as in the case of the first to third embodiments, on the basis of the beat frequency $f_0$ outputted by the gyro in the state of the sensitivity S and the angular velocity 0 stored in the memory, the angular velocity $\Omega$ in the X-direction and the Y-direction are calculated in accordance with expression (10).

At (582), predetermined multiplying calculation is effected on the obtained digital angular velocity data.

At (583), the result obtained by effecting the multiplying calculation is added to the result till the last time. In the case of the first multiplication, the addition is made to a predetermined initial value. Such processing is repeated at a predetermined cycle, whereby the angular velocity data is integrated and becomes angular displacement data, i.e., data representative of the angle θ of hand vibration shown in FIG. 7B.

At (584), the optimum amounts of electrical energization of the first correction lens system driving coil 463 and the second correction lens system driving coil 464 are calculated to move the correction lens system 412b by ψ in conformity with the angular displacement data δ so as to negate hand vibration.

At (585), a control signal is outputted to the first correction lens system driving driver 461 and the second correction lens system driving driver 462 on the basis of the calculated amounts of electrical energization.

In this manner, the blur correcting operation is performed at a predetermined cycle, and shift is made to (552).

At (552), the shutter 447 is controlled in accordance with the exposure determined at the step (530). When the use of the flash means 454 has been determined, a control signal is outputted so as to effect the light emission of the flash means 454. Thereby the exposure of the film is effected.

When at (553), the exposure is terminated, the timer interruption for blur correction permitted at (551) is made non-permitted and the blur correcting operation is terminated.

At (554), a control signal is outputted to the first motor driver 448 so as to drive the first motor 420 in the forward direction. Thereby the winding-up of the film is started.

At (555), a signal is outputted to the magnetic signal interface circuit 451 so that various kinds of photographing information such as year, month, day, hour and minute may be recorded on the magnetic track on the film.

At (556), the recording of the photographing information is terminated, and for the next frame in the film to be photographed to be set at a predetermined photographing position in accordance with the signal of the perforation detection means 446 is waited for.

At (557), a control signal is outputted to the first motor driver 448 so as to stop the first motor 420.

At (558), whether the exposure of the last frame in the film has been terminated is checked up. If the exposure of the last frame has not yet been terminated, return is made to (524), where the flow is repeated. If the exposure of the last frame has been terminated, advance is made to (559).

At (559), a control signal is outputted to the first motor driver 448 so as to drive the first motor 420 in the backward direction. Thereby the rewinding of the film is started.

At (560), for the film to be completely rewound into the cartridge in accordance with the signal of the perforation detection means 446 is waited for.

At (561), for the information indicator to assume a predetermined stop position representative of the exposure having been done is waited for while the output signal of the film information reading means 445 is being read.

At (562), a control signal is outputted to the first motor driver 448 so as to stop the first motor 420.

Thereafter, advance is made to the step (513) and subsequent steps, where the removal of the film is waited for.

While the embodiments of the present invention have been described above, the sampling at 1 msec. each and the numerical values of the beat frequency shown by way of example are examples to the last, and the present invention is not always restricted to such numerical values.

Also, the apparatuses to which the angular velocity detecting apparatus proposed by this application are not limited to cameras, but the angular velocity detecting apparatus of the present invention can be utilized in various apparatuses such as a navigation apparatus and amusement instruments.

Also, regarding the detection of the beat frequency created by the gyro, the detection by an electric current and the detection by impedance are conceivable besides the detection by a voltage described in this application.

According to the present invention described above, the processing circuit portion scarcely includes an analog circuit and therefore is suitable for making an integrated circuit by the CMOS process or the like, and there can be realized an angular velocity detecting apparatus easy to mount on a compact electronic apparatus.

Also, according to the present invention, it is possible to restrain the electric current consumed by a circuit in a compact apparatus such as a camera and reduce the manufacturing cost.

What is claimed is:

1. An angular velocity detecting apparatus comprising:
   an optical gyro having a terminal for detecting any change in at least one of an electric current, a voltage and an impedance in a ring laser, wherein said ring laser includes a tapered light waveguide of an asymmetrical shape in at least a portion of a light waveguide so that the oscillation threshold values of laser beams propagating round in opposite directions of rotation may differ from each other;

a measuring device which measures cycle of the change in at least one of the electric current, the voltage and the impedance outputted from the terminal of said optical gyro;

a clock generation device which generates a predetermined clock for sampling; and a calculation circuit to which is inputted data measured by said measuring device at a predetermined sampling cycle in accordance with the predetermined clock for sampling from said clock generation device, and which performs calculation on information regarding an angular velocity on the basis of the result of the measurement;

the predetermined sampling cycle generated by said clock generation device being longer than the cycle of the change in at least one of the electric current, the voltage and the impedance produced by said optical gyro within the necessary range for the detection of the angular velocity.

2. An angular velocity detecting apparatus according to claim 1, wherein said measuring device measures the number at which a clock signal for measurement having a predetermined cycle generated by said clock generation device is measured in the cycle of the change in at least one of the electric current, the voltage and the impedance.

3. A navigation device comprising the angular velocity detector of claim 1.

4. The navigation device according to claim 3, wherein said measuring device measures the number at which a clock signal for measurement having a predetermined cycle generated by the clock generation device is measured in the cycle of the change in at least one of said electric current, said voltage and said impedance.

5. A camera comprising the angular velocity detector of claim 1.

6. The camera according to claim 5, wherein said measuring device measures the number at which a clock signal for measurement having a predetermined cycle generated by the clock generation device is measured in the cycle of the change in at least one of said electric current, said voltage and said impedance.

7. An angular velocity detecting apparatus comprising:

an optical gyro having a terminal for detecting any change in at least one of an electric current, a voltage and an impedance in a ring laser, wherein said ring laser includes a tapered light waveguide of an asymmetrical shape in at least a portion of a light waveguide so that the oscillation threshold values of laser beams propagating round in opposite directions of rotation may differ from each other;

a measuring device which measures frequency of the change in at least one of the electric current, the voltage and the impedance outputted from the terminal of said optical gyro;

a clock generation device which generates a predetermined clock for sampling; and a calculation circuit to which is inputted the data measured by said measuring device at a predetermined sampling frequency in accordance with the predetermined clock for sampling from said clock generation device, and which performs calculation on information regarding an angular velocity on the basis of the result of the measurement;

the predetermined sampling frequency generated by said clock generation device being lower than the frequency of the change in at least one of the electric current, the voltage and the impedance produced by said optical gyro within the necessary range for the detection of the angular velocity.

8. An angular velocity detecting apparatus according to claim 7, wherein said measuring device measures the number of the frequency signals of the change in at least one of the electric current, the voltage and the impedance produced by said optical gyro within a sample time conforming to the predetermined sampling frequency generated by said clock generation device.

9. A navigation device comprising the angular velocity detector of claim 7.

10. The navigation device according to claim 9, wherein said measuring device measures the number of the frequency signals of the change in at least one of said electric current, said voltage and said impedance produced by said optical gyro within a sample time conforming to a predetermined sampling frequency generated by the clock generation device.

11. A camera comprising the angular velocity detector of claim 7.

12. The camera according to claim 11, wherein said measuring device measures the number of the frequency signals of the change in at least one of said electric current, said voltage and said impedance produced by said optical gyro within a sample time conforming to a predetermined sampling frequency generated by the clock generation device.

* * * * *